(12) United States Patent
Kakehata

(10) Patent No.: US 7,723,205 B2
(45) Date of Patent: May 25, 2010

(54) SEMICONDUCTOR DEVICE, MANUFACTURING METHOD THEREOF, LIQUID CRYSTAL DISPLAY DEVICE, RFID TAG, LIGHT EMITTING DEVICE, AND ELECTRONIC DEVICE

(75) Inventor: Tetsuya Kakehata, Isehara (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 757 days.

(21) Appl. No.: 11/520,744

(22) Filed: Sep. 14, 2006

(65) Prior Publication Data

US 2007/0069401 A1    Mar. 29, 2007

(30) Foreign Application Priority Data

Sep. 27, 2005    (JP) ............... 2005-280499

(51) Int. Cl.
    *H01L 21/76*    (2006.01)
(52) U.S. Cl. .............. 438/431; 438/769; 438/771; 438/775; 438/776; 257/E21.475
(58) Field of Classification Search ........... 438/431, 438/769–771, 775, 776, 795
    See application file for complete search history.

(56) References Cited

U.S. PATENT DOCUMENTS

| | | | |
|---|---|---|---|
| 5,882,960 A | 3/1999 | Zhang et al. | |
| 5,895,933 A | 4/1999 | Zhang et al. | |
| 6,730,549 B1 | 5/2004 | Zhang et al. | |
| 6,756,657 B1 | 6/2004 | Zhang et al. | |
| 6,818,852 B2 | 11/2004 | Ohmi et al. | |
| 7,094,639 B2 | 8/2006 | Kubota et al. | |
| 7,148,094 B2 | 12/2006 | Zhang et al. | |
| 2002/0020497 A1 | 2/2002 | Ohmi et al. | |
| 2004/0050494 A1 | 3/2004 | Ohmi et al. | |
| 2004/0217431 A1 | 11/2004 | Shimada | |
| 2009/0170340 A1* | 7/2009 | Kitagawa et al. | ............ 438/766 |
| 2009/0170341 A1* | 7/2009 | Kitano et al. | ............ 438/770 |

FOREIGN PATENT DOCUMENTS

| | | |
|---|---|---|
| CN | 1267902 A | 9/2000 |
| CN | 1505114 A | 6/2004 |

(Continued)

OTHER PUBLICATIONS

Nikkei Microdevices, Report [LSI], *The Advancing Introduction of Plasma Oxynitriding Apparatus Adopted by More Than 10 LSI Makers*, Apr. 2005, pp. 100-103.

(Continued)

*Primary Examiner*—Hsien-ming Lee
(74) *Attorney, Agent, or Firm*—Eric J. Robinson; Robinson Intellectual Property Law Office, P.C.

(57) ABSTRACT

There is provided a semiconductor device, in which characteristics of the semiconductor device are improved by thinning a gate insulating film and a leak current can be reduced, and a manufacturing method thereof. An aluminum film which is a metal film is formed over a polycrystalline semiconductor film, and plasma oxidizing treatment is performed to the aluminum film, whereby an aluminum oxide film is formed by oxidizing the aluminum film, and a silicon oxide film is formed between the polycrystalline semiconductor film and the aluminum oxide film.

14 Claims, 28 Drawing Sheets

FOREIGN PATENT DOCUMENTS

| | | |
|---|---|---|
| EP | 0631325 A | 12/1994 |
| EP | 1026751 A | 8/2000 |
| EP | 1026752 A | 8/2000 |
| EP | 1416525 A | 5/2004 |
| JP | 2004-319952 | 11/2004 |
| JP | 2005-079176 | 3/2005 |
| JP | 2005-086023 | 3/2005 |

OTHER PUBLICATIONS

Office Action (Application No. 200610139950.8) Dated Jul. 3, 2009.

* cited by examiner

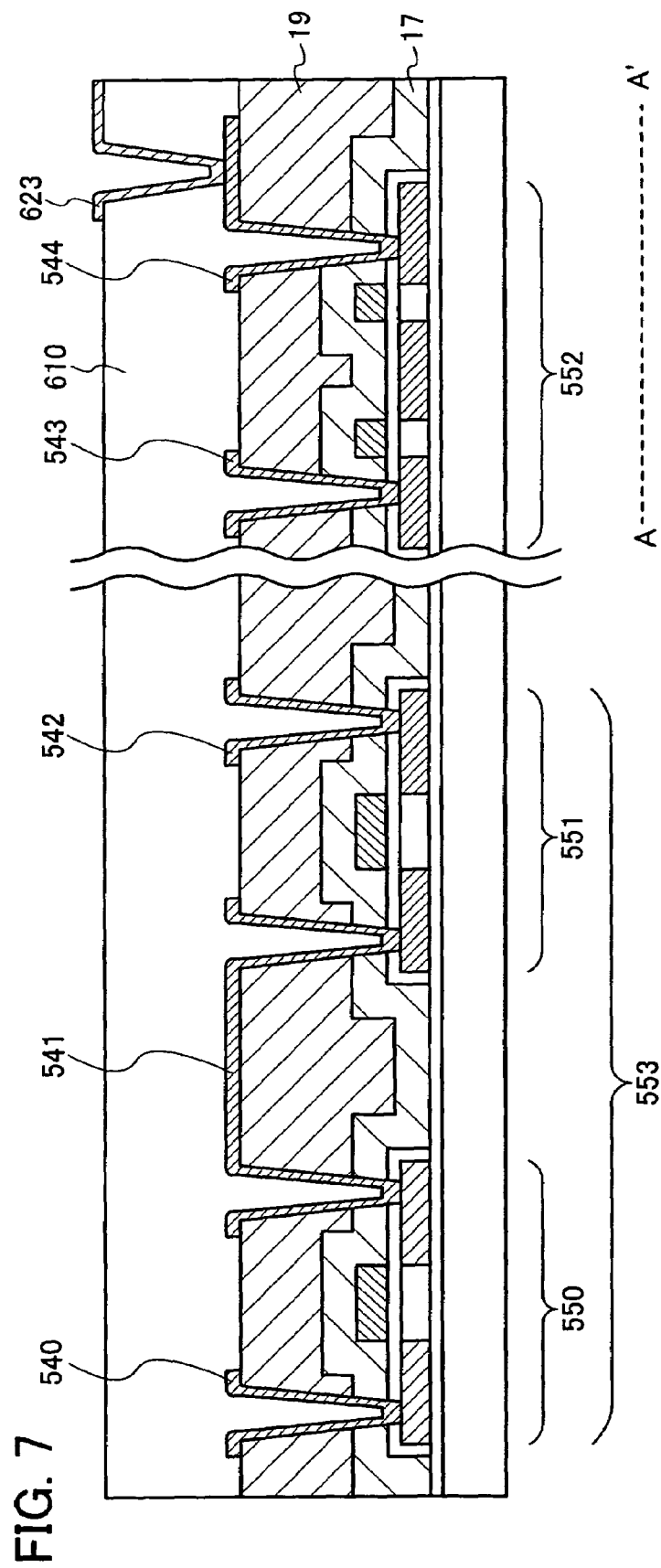

500, 600, 650

629

625

1140    1133    1141

1101
1103
1133
1143

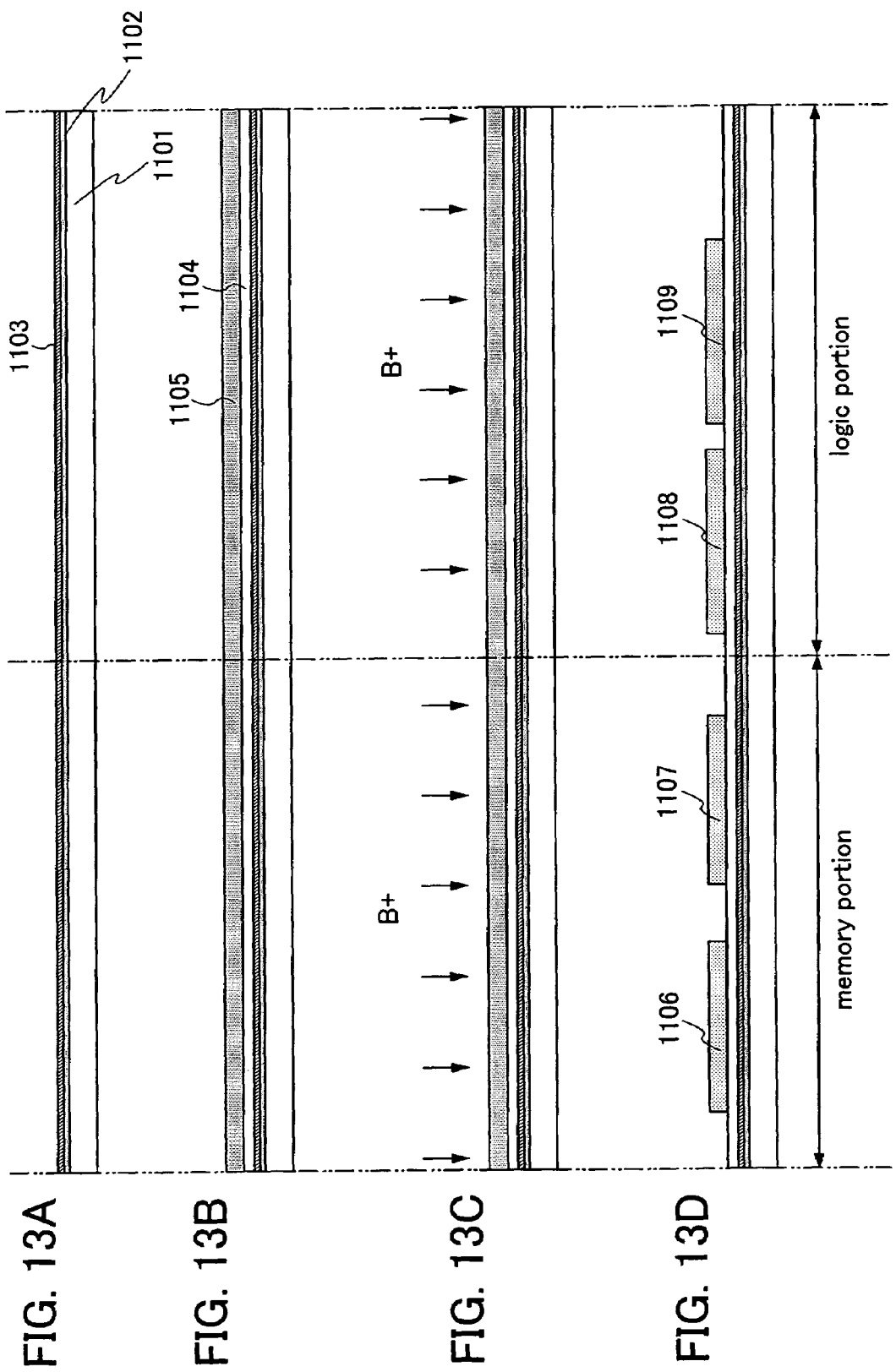

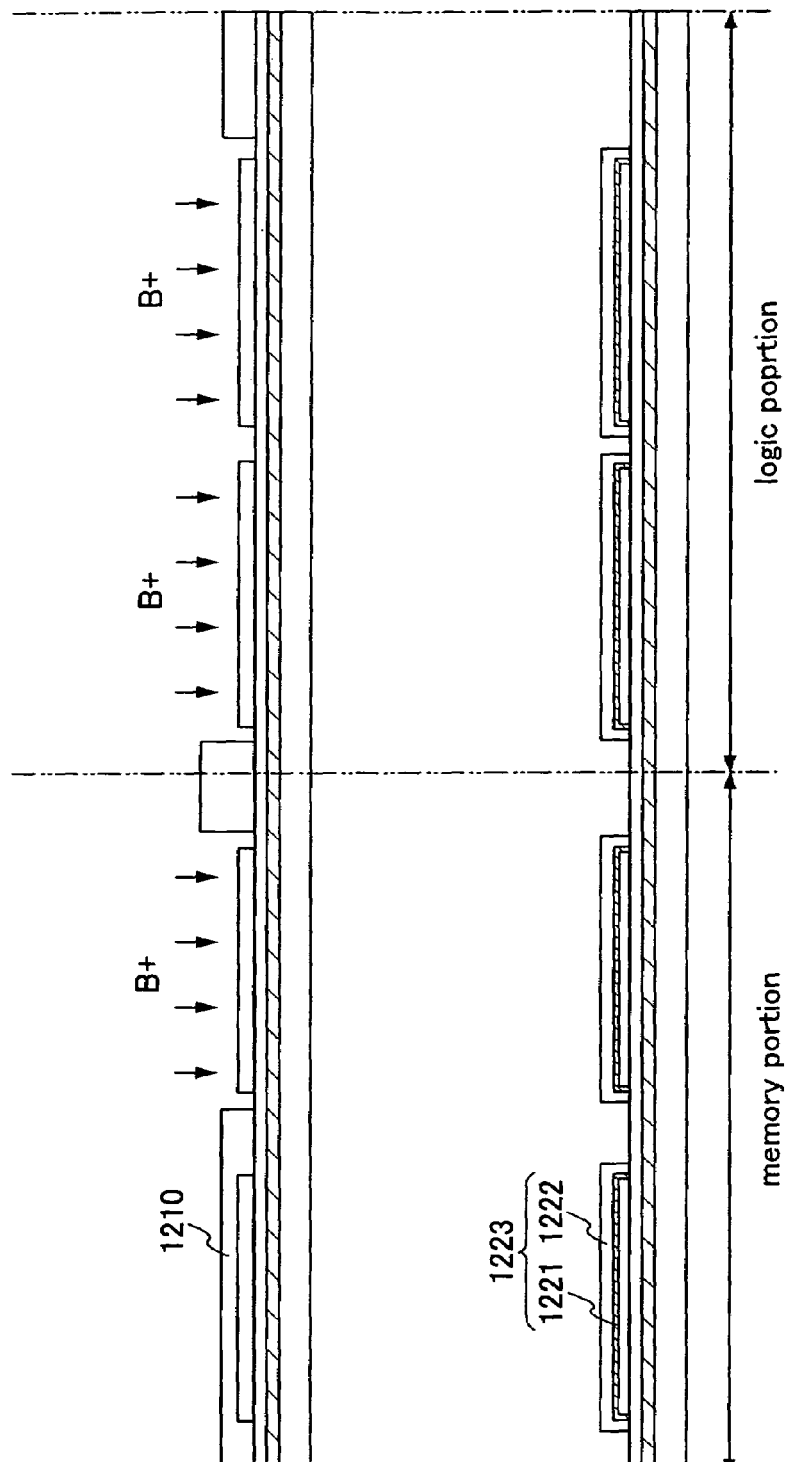

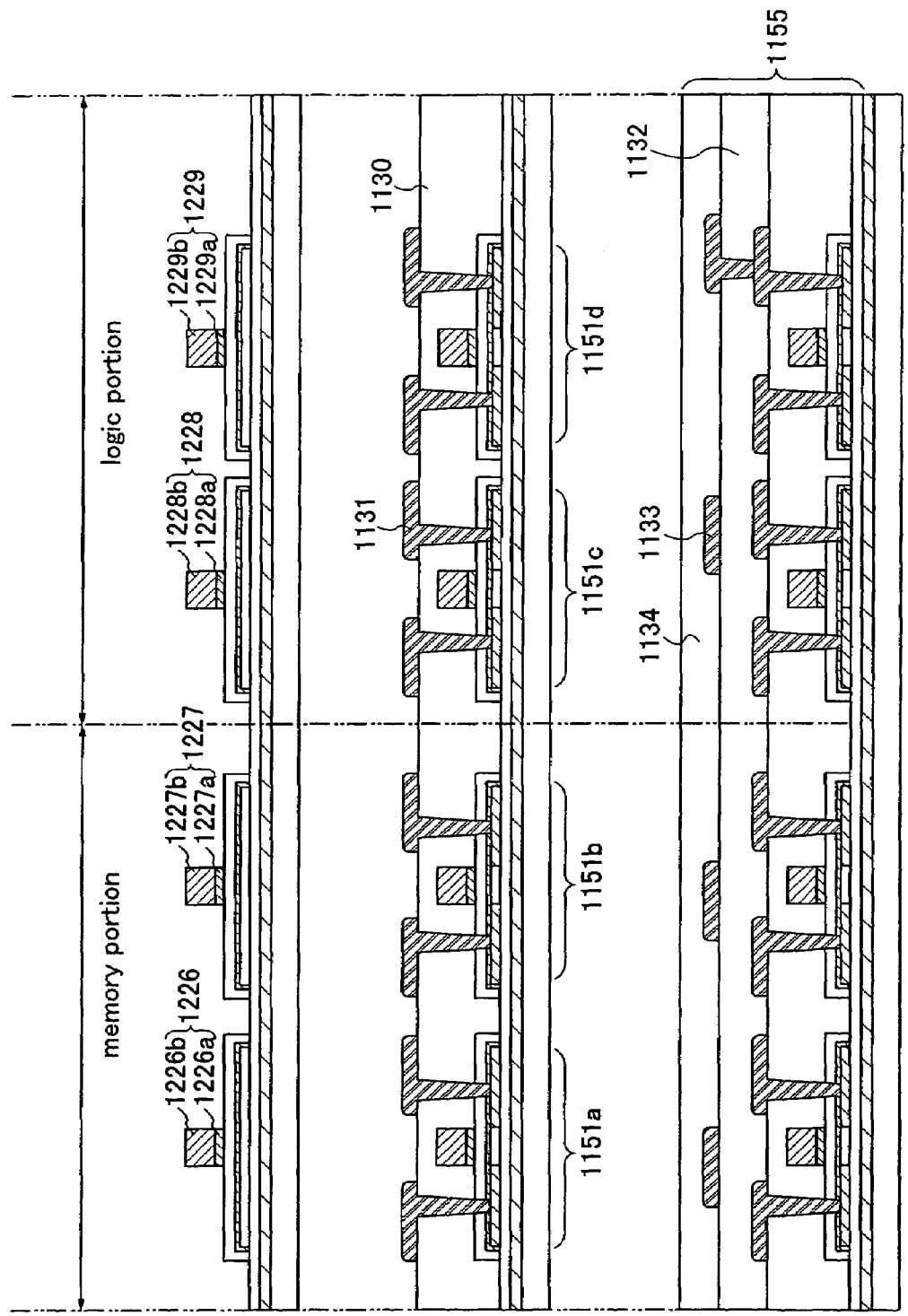

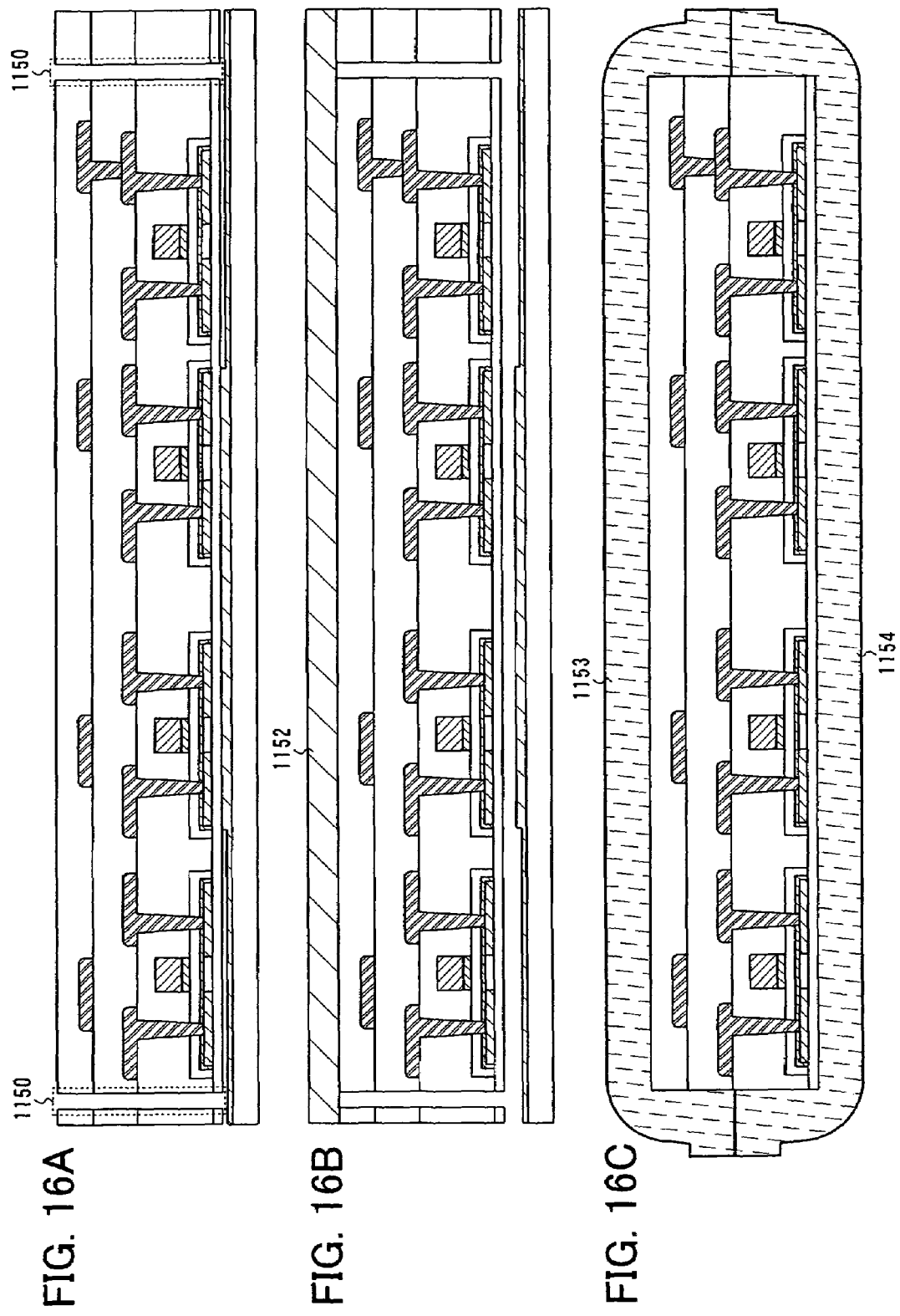

base insulating film, amorphous silicon film formation laser irradiation

10: substrate
11: base insulating film (shown here as two layers)
12: amorphous silicon film
13: crystalline silicon film

SEMICONDUCTOR DEVICE, MANUFACTURING METHOD THEREOF, LIQUID CRYSTAL DISPLAY DEVICE, RFID TAG, LIGHT EMITTING DEVICE, AND ELECTRONIC DEVICE

BACKGROUND OF THE INVENTION

1. Field of the Invention

The present invention relates to a semiconductor device, a manufacturing method of the semiconductor device, a liquid crystal display device, an RFID (Radio Frequency Identification) tag, a light emitting device, and an electronic device. In particular, the present invention relates to a semiconductor device in which characteristics of the semiconductor device are improved by thinning a gate insulating film and a leak current can be reduced, a manufacturing method of the semiconductor device, a liquid crystal display device, an RFID tag, a light emitting device, and an electronic device.

2. Description of the Related Art

When a semiconductor device is miniaturized, a thickness of a gate insulating film is thinned by scaling law. In a conventional semiconductor device formed over a single crystal silicon substrate, a tunnel current is generated when a gate insulating film is thin. In order to overcome an increase of the tunnel current, an insulating film having a high dielectric constant such as a hafnium oxide film or an aluminum oxide film tends to be employed for a gate insulating film so as to have a thin equivalent oxide thickness while keeping a substantial thickness of the gate insulating film. A tunnel current is particularly generated in a thickness of 2 nm or less.

However, when an insulating film having a high dielectric constant is used for a gate insulating film, interface state density cannot be reduced. Therefore, there is proposed a method by which interface state density is reduced by forming a silicon nitride film in an interface with a single crystal silicon substrate, that is, a method by which interface state density is reduced by using a film formed of an aluminum oxide film stacked over a silicon nitride film for a gate insulating film.

More in detail, an amorphous silicon oxide film is formed over a surface of a single crystal silicon substrate, and an aluminum film is formed over the amorphous silicon oxide film. Thereafter, by heat treatment, an aluminum oxide film is formed over the single crystal silicon substrate. Then, by a microwave low temperature plasma nitriding method, a silicon nitride film is formed between the surface of the single crystal silicon substrate and the aluminum oxide film. Accordingly, a gate insulating film that is a stacked film of the silicon nitride film and the aluminum oxide film is formed over the single crystal silicon substrate (see Reference 1: Japanese Patent Application Laid-Open No: 2005-86023).

In a semiconductor device formed over a glass substrate, as shown in FIG. 28A, a base insulating film 11 including two layers is formed over a glass substrate 10, and an amorphous silicon film 12 is formed over the base insulating film 11. Thereafter, as shown in FIG. 28B, the amorphous silicon film 12 is irradiated with laser light to form a crystalline silicon film 13, and a gate insulating film (not illustrated) formed of a silicon oxide film or the like may be formed over the surface of the crystalline silicon film 13. The surface of the crystalline silicon crystallized by a laser has the surface roughness (unevenness on the surface) that is significantly large as compared with single crystal silicon. Therefore, a current leak path such as a tunnel current tends to be generated in a portion with a thin thickness of a gate insulating film, which is formed of a silicon oxide film (or a silicon oxynitride film) having a thickness of approximately 5 nm by a plasma CVD (chemical vapor deposition) method or a plasma oxidizing method. The current leak path is easily generated when a silicon oxide film becomes thin, which is formed on the top or in a concave portion of unevenness on the crystalline silicon film surface shown in FIG. 28B. In other words, when a gate insulating film is thinned, a tunnel current due to unevenness on a crystalline silicon film surface is increased.

In addition, in the conventional semiconductor device formed over the single crystal silicon substrate as described above, a stacked film in which an aluminum oxide film is stacked over a silicon nitride film is used as a gate insulating film; therefore, the silicon nitride film is in contact with the silicon surface. In this structure, transistor characteristics such as a threshold value or a hysteresis are lowered as compared with a structure in which a silicon oxide film is in contact with a silicon surface. In other words, in consideration of the transistor characteristics, it is desirable that a silicon oxide film be in contact with a silicon surface.

SUMMARY OF THE INVENTION

The present invention is made in view of the foregoing conditions, and an object thereof is to provide a semiconductor device in which characteristics of the semiconductor device are improved by thinning a gate insulating film and a leak current can be reduced, a manufacturing method of the semiconductor device, a liquid crystal display device, an RFID tag, a light emitting device, and an electronic device.

In order to solve the above problems, according to one feature of the present invention, a method for manufacturing a semiconductor device includes the steps of forming a metal film over a polycrystalline semiconductor film; and performing plasma oxidizing treatment to the metal film, thereby oxidizing the metal film to form a metal oxide film and oxidizing the polycrystalline semiconductor film to form an oxide film between the polycrystalline semiconductor film and the metal oxide film.

According to another feature of the present invention, a method for manufacturing a semiconductor device includes the steps of forming a metal film over a polycrystalline semiconductor film; performing plasma nitriding treatment to the metal film, thereby nitriding the metal film to form a metal nitride film; and performing plasma oxidizing treatment to the metal nitride film, thereby oxidizing the metal nitride film to form a metal oxide film and oxidizing the polycrystalline semiconductor film to form an oxide film between the polycrystalline semiconductor film and the metal oxide film, where nitrogen is left at the surface of the metal oxide film.

According to another feature of the present invention, a method for manufacturing a semiconductor device includes the steps of forming a metal film over a polycrystalline semiconductor film; performing plasma oxidizing treatment to the metal film, thereby oxidizing the metal film to form a metal oxide film and oxidizing the polycrystalline semiconductor film to form an oxide film between the polycrystalline semiconductor film and the metal oxide film; and performing plasma nitriding treatment to the metal oxide film, thereby including nitrogen at the surface of the metal oxide film.

In the method for manufacturing a semiconductor device according to the present invention, the metal film is preferably one of an Al film, a Ta film, a La film, an Hf film, and a Zr film. In addition, in the method for manufacturing a semiconductor device according to the present invention, preferably, the polycrystalline semiconductor film has unevenness over the surface and is formed by crystallizing an amorphous semiconductor film using a laser before forming a metal film over the polycrystalline semiconductor film.

According to another feature of the present invention, a semiconductor device includes an oxide film formed over a polycrystalline semiconductor film, which is formed by oxidizing the polycrystalline semiconductor film; a metal oxide film formed over the oxide film; a gate electrode formed over the metal oxide film; and a source region and a drain region which are formed in the polycrystalline semiconductor film, where the oxide film and the metal oxide film form a gate insulating film.

According to another feature of the present invention, a semiconductor device includes a base insulating film formed over a glass substrate; a polycrystalline semiconductor film formed over the base insulating film; a source region and a drain region formed in the polycrystalline semiconductor film; an oxide film formed over the polycrystalline semiconductor film, which is formed by oxidizing the polycrystalline semiconductor film; a metal oxide film formed over the oxide film; and a gate electrode formed over the metal oxide film, where the oxide film and the metal oxide film form a gate insulating film.

In the semiconductor device according to the present invention, the metal oxide film can also be formed by oxidizing a metal nitride film. In addition, in the semiconductor device according to the present invention, nitrogen can be contained in the surface of the metal oxide film. Further, in the semiconductor device according to the present invention, the metal oxide film is one of an aluminum oxide film, a tantalum oxide film, a lanthanum oxide film, a hafnium oxide film, and a zirconium oxide film.

In the semiconductor device according to the present invention, a thickness of the oxide film is preferably 0.5 nm or more and 1 nm or less. In addition, in the semiconductor device according to the present invention, the surface of the polycrystalline semiconductor film may become uneven. Further, a liquid crystal display device, an RFID tag, a light emitting device, and an electronic device according to the present invention each includes the semiconductor device as set forth above.

As described above, the present invention can provide a semiconductor device in which characteristics of the semiconductor device are improved by thinning a gate insulating film and a leak current can be reduced, a manufacturing method of the semiconductor device, a liquid crystal display device, an RFID tag, a light emitting device, and an electronic device.

BRIEF DESCRIPTION OF THE DRAWINGS

In the accompanying drawings:

FIG. 7 is a cross-sectional view explaining a manufacturing method of a liquid crystal display device according to Embodiment Mode 6;

FIGS. 13A to 13D are cross-sectional views each explaining a manufacturing method of a semiconductor device according to Embodiment Mode 7;

FIGS. 14A and 14B are cross-sectional views each explaining a manufacturing method of a semiconductor device according to Embodiment Mode 7;

FIGS. 15A to 15C are cross-sectional views each explaining a manufacturing method of a semiconductor device according to Embodiment Mode 7;

FIGS. 16A to 16C are cross-sectional views each explaining a manufacturing method of a semiconductor device according to Embodiment Mode 7;

DESCRIPTION OF THE INVENTION

Figure 1A:
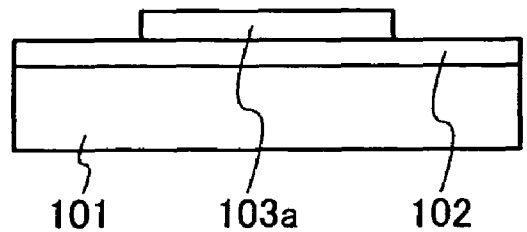
FIGS. 1A to 1D are cross-sectional views each showing a manufacturing method of a semiconductor device according to Embodiment Mode 1.

Hereinafter, embodiment modes of the present invention will be described with reference to the accompanying drawings. It is to be noted that the present invention is not limited to a following description, and it is easily understood by those skilled in the art that modes and details thereof can be modified in various ways without departing from the spirit and the scope of the invention. Therefore, the present invention should not be interpreted as being limited to the description of the embodiment modes to be given below. Further, in the structure of the present invention, which will be described below, the same reference numerals are used for the same portions or portions having the same functions in different drawings, and a repeated explanation thereof will be omitted. In addition, following embodiment modes can be freely combined to be used.

Embodiment Mode 1

FIGS. 1A to 1D are cross-sectional views each showing a manufacturing method of a semiconductor device according to Embodiment Mode 1 of the present invention.

Figure 28A:
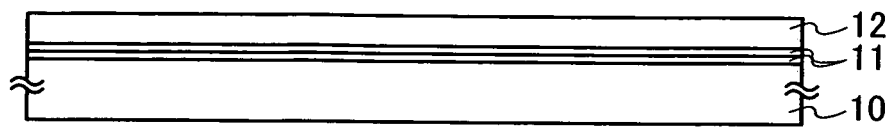
FIGS. 28A and 28B are cross-sectional views showing a step of crystallizing amorphous silicon over a glass substrate by using a laser.
Figure 28B:
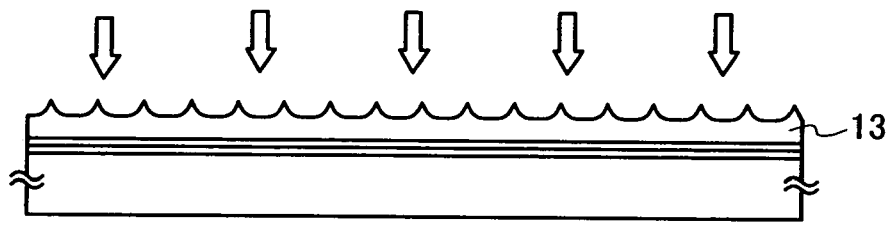

First, an island-shaped polycrystalline semiconductor film (e.g. polysilicon film) 103a is formed over a glass substrate 101 (FIG. 1A). It is preferable to use a silicon film or a silicon germanium film as the semiconductor film. The same also applies to other embodiment modes. The island-shaped polysilicon film 103a can be provided as follows: An amorphous semiconductor film such as an amorphous silicon film having a thickness of approximately 30 to 200 nm is formed over an insulating film 102, which is formed over a glass substrate 101 in advance, by a sputtering method, an LPCVD method, a plasma CVD method, or the like; dehydrogenation is performed to the amorphous silicon film by heating at temperatures of 450 to 500° C.; the amorphous silicon film is crystallized to form a polysilicon film; and the polysilicon film is selectively etched. It is to be noted that the amorphous silicon film is crystallized by a laser crystallization method using an excimer laser or the like. In laser crystallization, unevenness (ridges) is formed at the surface of the polysilicon film (not shown in FIGS. 1A to 1D but shown in FIG. 28B). Before the laser crystallization, catalytic metal may be added to the amorphous silicon film so as to perform solid phase crystallization. In addition, channel-doping is performed to the polysilicon film as needed.

Figure 1B:
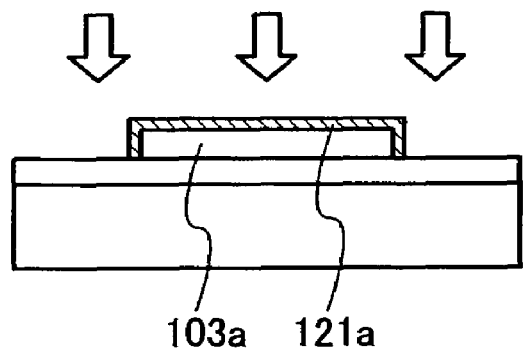

Subsequently, an aluminum film 121a is formed over the island-shaped polysilicon film 103a by an MOCVD method (FIG. 1B). By using an MOCVD method, the aluminum film 121a can be selectively formed only over the surface of the island-shaped polysilicon film 103a. A single crystal aluminum film is preferably formed as the aluminum film 121a. It is to be noted that the aluminum film 121a is formed by an MOCVD method here; however, a metal film other than the aluminum film and a film forming method other than an MOCVD method (such as a sputtering method or an evaporation method) can also be used. As the metal film, a metal film which has a high dielectric constant when oxidized may be used. For example, Ta (tantalum), La (lanthanum), Hf (hafnium), or Zr (zirconium) can be used.

Figure 1C:
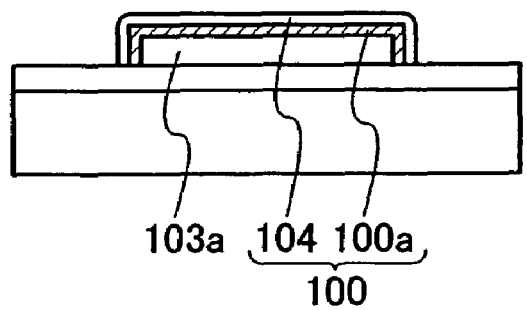

Next, plasma treatment is performed to the aluminum film 121a in an atmosphere containing oxygen to form an aluminum oxide film 104 which is a metal oxide film. Then, plasma treatment is further performed to the aluminum oxide film 104 in an atmosphere containing oxygen to form a silicon oxide film 100a having a thickness of approximately 0.5 to 1 nm between the polysilicon film 103a and the aluminum oxide film 104 (FIG. 1C). Accordingly, a gate insulating film 100 formed of the aluminum oxide film 104 and the silicon oxide film 100a is formed over the polysilicon film 103a. It is to be noted that the plasma treatment is preferably performed with electron density of $1.0 \times 10^{11}$ cm$^{-3}$ or higher (preferably, $1.0 \times 10^{11}$ cm$^{-3}$ or higher and $1.0 \times 10^{13}$ cm$^{-3}$ or lower) and plasma electron temperatures of 1.5 eV or lower (preferably, 0.5 eV or higher and 1.5 eV or lower). In addition, a relative dielectric constant k of aluminum oxide is 8.5 to 10, and it is preferable that a thickness of the aluminum oxide film 104 be approximately 7 to 21 nm, more preferably 8 to 11 nm. As a raw material gas containing oxygen in performing plasma oxidation, a mixed gas of oxygen ($O_2$) and a rare gas, a mixed gas of oxygen, hydrogen ($H_2$), and a rare gas, or the like is preferably used. As the rare gas, it is preferable to use at least one of helium (He), neon (Ne), argon (Ar), krypton (Kr), and xenon (Xe). In addition, it is considered that the metal oxide film formed by plasma oxidation contains a rare gas element contained in the raw material gas.

In addition, when Ta, La, Hf, or Zr is used as the metal film as described above and a gate insulating film is formed of a silicon oxide film having a thickness of 0.5 to 1 nm and a metal oxide film, a thickness of the metal oxide film is preferably set as follows: A thickness of tantalum oxide is approximately 18 to 47 nm, more preferably 25 to 28 nm, and a relative dielectric constant is approximately 25; a thickness of lanthanum oxide is approximately 20 to 50 nm, more preferably 27 to 30 nm, and a relative dielectric constant is approximately 27; a thickness of hafnium oxide is approximately 18 to 45 nm, more preferably 24 to 27 nm, and a relative dielectric constant is approximately 24; and a thickness of zirconium oxide is approximately 8 to 35 nm, more preferably 11 to 20 nm, and a relative dielectric constant is approximately 11.0 to 18.5. It is to be noted that, when a thickness of the silicon oxide film is increased, a necessary metal oxide film can be thin. However, it is preferable not to make the silicon oxide film be too thick because it is not easy to form the metal film to be uniformly thin. In addition, it is considered that the gate insulating film is required to be easily etched, chemically stable, and not crystallized in a heat treatment step (when the gate insulating film is crystallized to be polycrystal, a leak current is increased). In view of the above matter, it is more preferable to use aluminum oxide or tantalum oxide as the metal oxide film.

Figure 1D:
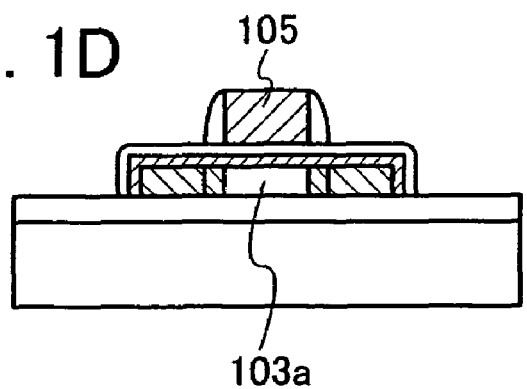

Then, a gate electrode 105 and the like are formed over the gate insulating film 100, and a thin film transistor (TFT) using the island-shaped polysilicon film 103a as a channel forming region can be manufactured (FIG. 1D). It is to be noted that, as a material of the gate electrode, aluminum, tungsten, molybdenum, tantalum, titanium, silicide of the above metal, or the like can be used.

According to Embodiment Mode 1, when the gate insulating film 100 is formed by using a metal oxide film such as an aluminum oxide film that is an insulating film having a high dielectric constant, an equivalent oxide thickness can be thin while keeping a substantial thickness of the gate insulating film. Accordingly, characteristics of the semiconductor device can be improved, and a tunnel current, which is generated when a thickness of the gate insulating film becomes thin, can be prevented from increasing.

Embodiment Mode 2

A manufacturing method of a semiconductor device according to Embodiment Mode 2 of the present invention is different from the method of Embodiment Mode 1 in that: After an aluminum film is formed over an island-shaped polycrystalline semiconductor film (e.g. polysilicon film), plasma treatment is performed to the aluminum film in an atmosphere containing nitrogen to form an aluminum nitride film which is a metal nitride film; plasma treatment is further performed to the aluminum nitride film in an atmosphere containing oxygen to form an aluminum oxide film (containing nitrogen) which is a metal oxide film containing nitrogen; and then, plasma treatment is performed to the aluminum oxide film in an atmosphere containing oxygen to form a silicon oxide film having a thickness of approximately 0.5 to 1 nm between the polysilicon film and the aluminum oxide film. When oxidizing treatment is performed after nitriding treatment as described above, the metal nitride film is almost oxidized to be the metal oxide film, and about several % of nitrogen is preferably left at the surface. This nitriding treatment is performed in order to modify the surface of the metal oxide film; thus, the aluminum nitride film is not necessarily formed to be thick. Further, as a raw material gas containing nitrogen in performing plasma nitriding, a mixed gas of nitrogen ($N_2$) and a rare gas, a mixed gas of ammonia ($NH_3$) and a rare gas, a mixed gas of nitrogen, hydrogen ($H_2$), and a rare gas, or the like is preferably used. As the rare gas, it is preferable to use at least one of helium (He), neon (Ne), argon (Ar), krypton (Kr), and xenon (Xe). In addition, it is considered that the metal nitride film formed by plasma nitriding contains a rare gas element contained in the raw material gas. Further, as the raw material gas containing oxygen in performing plasma oxidation, the same gas as in Embodiment Mode 1 is preferably used.

It is to be noted that a thickness of the aluminum oxide film is the same as that in Embodiment Mode 1. In addition, instead of the aluminum oxide film, other metal oxide film described in Embodiment Mode 1 having the same thickness can be used as a gate insulating film.

The same advantageous effect as in Embodiment Mode 1 can be obtained also in Embodiment Mode 2. In addition, when refractory metal (such as W or Mo) is used for a gate electrode, adhesion between the gate electrode and the metal oxide film can be improved because, by leaving nitrogen at the surface of the metal oxide film, metal nitride is left at the surface of the metal oxide film.

Embodiment Mode 3

A manufacturing method of a semiconductor device according to Embodiment Mode 3 of the present invention is different from the method of Embodiment Mode 1 in that: After an aluminum film is formed over an island-shaped polycrystalline semiconductor film (e.g. polysilicon film), plasma treatment is performed to the aluminum film in an atmosphere containing oxygen to form an aluminum oxide film which is a metal oxide film; plasma treatment is further performed to the aluminum oxide film in an atmosphere containing oxygen to form a silicon oxide film having a thickness of approximately 0.5 to 1 nm between the polysilicon film and the aluminum oxide film; and then, plasma treatment is performed to the aluminum oxide film in an atmosphere containing nitrogen to form an aluminum oxide film (containing nitrogen) which is a metal oxide film containing nitrogen. The nitriding treatment here is performed to a portion which is 1 to 2 nm deep from the surface of the aluminum oxide film, and about 20% of aluminum oxide at most is changed into aluminum nitride. A thickness after the nitriding treatment is scarcely changed from that before the nitriding treatment. This nitriding treatment is performed in order to modify the surface of the metal oxide film. In addition, as a raw material gas in plasma oxidation and plasma nitriding, the same gas as in Embodiment Modes 1 and 2 is preferably used.

It is to be noted that a thickness of the aluminum oxide film is the same as that in Embodiment Mode 1. Further, instead of the aluminum oxide film, other metal oxide film described in Embodiment Mode 1 having the same thickness can be used as a gate insulating film.

The same advantageous effect as in Embodiment Mode 1 can be obtained also in Embodiment Mode 3. In addition, when refractory metal (such as W or Mo) is used for a gate electrode, adhesion between the gate electrode and the metal oxide film can be improved because nitrogen is contained at the surface of the metal oxide film.

Embodiment Mode 4

Figure 2:
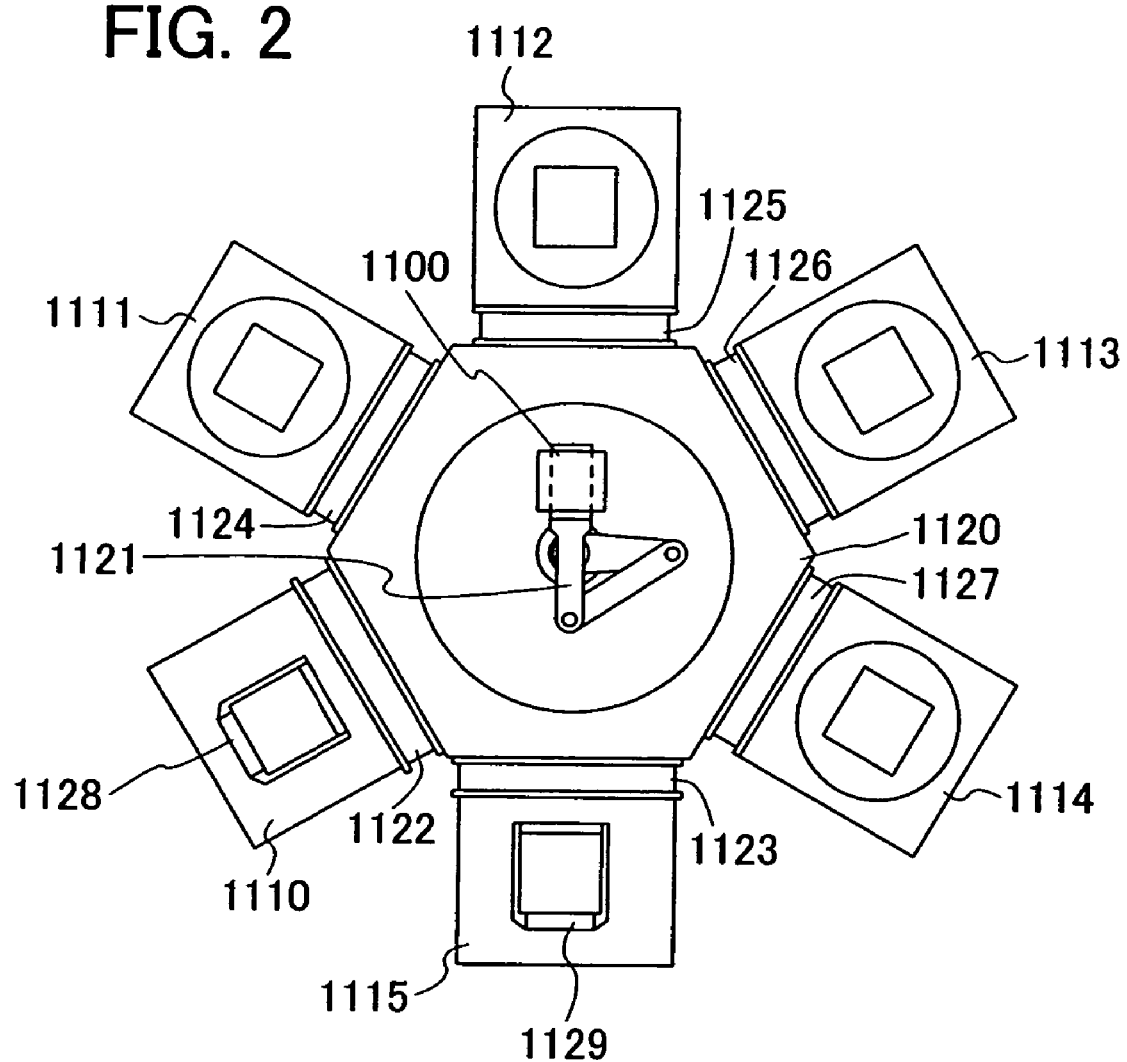
FIG. 2 is a structural view showing a multi-chamber apparatus applied to a manufacturing method of a semiconductor device according to Embodiment Mode 4.

FIG. 2 is a structural view showing a multi-chamber apparatus which is applied to a manufacturing method of a semiconductor device according to Embodiment Mode 4 of the present invention.

The multi-chamber apparatus shown in FIG. 2 has a first chamber 1111, a second chamber 1112, a third chamber 1113, a fourth chamber 1114, load lock chambers 1110 and 1115, and a common chamber 1120. Each chamber has airtightness and is provided with a vacuum evacuation pump and a gas introduction system.

The load lock chambers 1110 and 1115 are chambers for carrying a sample (a substrate to be processed) to a system. The first to fourth chambers are chambers to form a conductive film, an insulating film, or a semiconductor film over a substrate or to perform etching, plasma treatment, or the like. The common chamber 1120 is a common chamber for a sample arranged in common to the load lock chambers 1110 and 1115 and the first to fourth chambers. In addition, gate valves 1122 to 1127 are provided between the common chamber 1120 and the load lock chambers 1110 and 1115, and between the common chamber 1120 and the first to forth chambers 1111 to 1114. It is to be noted that a robot arm 1121 is provided in the common chamber 1120, which carries the substrate 1100 to be processed to each chamber.

Figure 3:
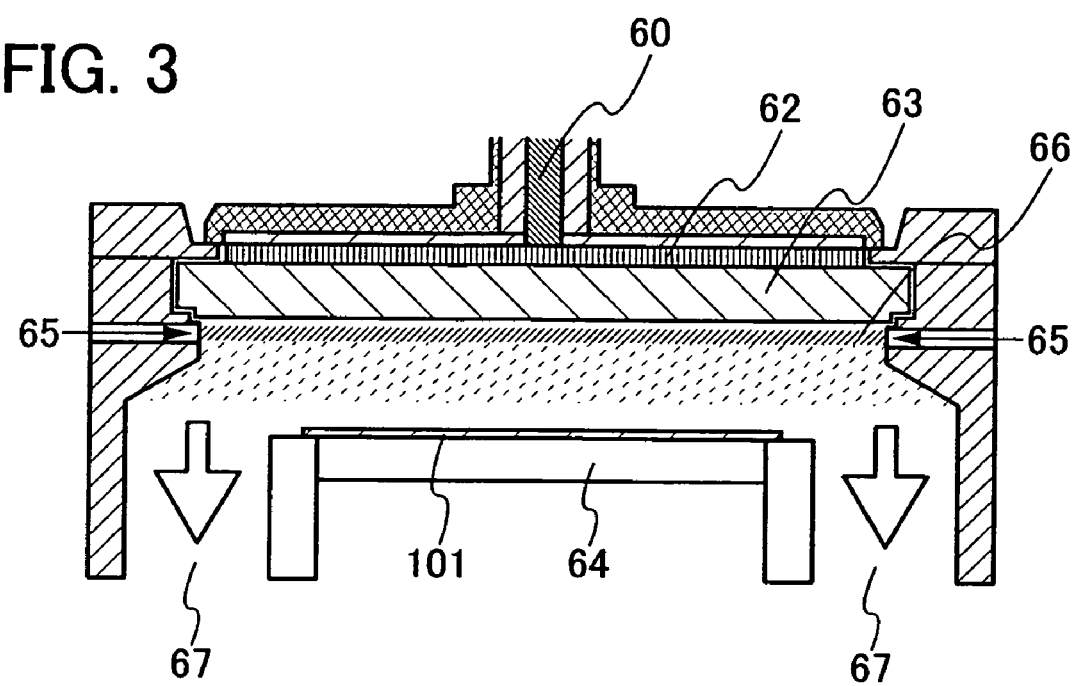
FIG. 3 is a structural view showing a plasma treatment apparatus provided in a second chamber of FIG. 2.

Hereinafter, a manufacturing method of a semiconductor device, which is the same as the semiconductor device shown in FIGS. 1A to 1D described in Embodiment Mode 1, will be described. Over a substrate having an island-shaped polysilicon film 103a shown in FIG. 1A manufactured by the same method as in Embodiment Mode 1, an aluminum film 121a is formed as a metal film in the first chamber 1111; plasma treatment is performed to the aluminum film in the second chamber 1112 to form a gate insulating film formed of an aluminum oxide film 104 which is a metal oxide film and a silicon oxide film 100a; a gate electrode is formed over the gate insulating film in the third chamber 1113; and radical ion irradiation annealing treatment is performed to the substrate surface in the fourth chamber 1114. In this embodiment mode, a plasma treatment apparatus as shown in FIG. 3 is provided in the second chamber 1112.

First, a cassette 1128 storing a plurality of substrates is carried to the load lock chamber 1110. After the cassette 1128 is carried therein, a door of the load lock chamber 1110 is closed. In this state, the gate valve 1122 is opened to take out a substrate to be processed from the cassette 1128, and then, the substrate is arranged in the common chamber 1120 by the robot arm 1121. Alignment of the substrate is performed in the common chamber 1120 at this time.

Then, the gate valve 1122 is closed, and the gate valve 1124 is opened to transfer the substrate to the first chamber 1111. In the first chamber 1111, a metal film is formed over the substrate by an MOCVD method, a sputtering method, or an evaporation method.

After the metal film is formed, the substrate is taken out to the common chamber 1120 by the robot arm 1121, and transferred to the second chamber 1112. In the second chamber 1112, plasma treatment is performed to form a gate insulating film formed of a metal oxide film and a silicon oxide film. It is to be noted that details of plasma treatment will be described later.

After the gate insulating film is formed, the substrate is taken out to the common chamber 1120 by the robot arm 1121, and transferred to the third chamber 1113. In the third chamber 1113, a gate electrode is formed over the gate insulating film. For example, in the third chamber 1113, a molybdenum film can be formed by a plasma CVD method or a sputtering method using molybdenum (Mo) as a target.

After the gate electrode is formed, the substrate is taken out to the common chamber 1120 by the robot arm 1121 and transferred to the fourth chamber 1114. In the fourth chamber 1114, radical ion irradiation annealing treatment is performed to modify the surface of the gate electrode. It is to be noted that the radical ion irradiation annealing treatment may also be omitted.

After the gate electrode is formed in this manner, the substrate is transferred to the load lock chamber 1115 by the robot arm 1121 to be stored in a cassette 1129.

It is to be noted that FIG. 2 shows only one example. For example, the number of the chambers may be increased to form a multilayer gate electrode. In addition, components that are not manufactured in the steps shown in this embodiment mode may also be manufactured by using this apparatus. In addition, FIG. 2 shows an example of employing single type chambers for the first to fourth chambers 1111 to 1114, but a plurality of substrates can also be processed in one time by employing a batch chamber.

By using the apparatus shown in FIG. 2, the gate insulating film and the gate electrode can be formed without once being exposed to atmospheric air. Therefore, contaminants can be prevented from being mixed, and productivity can be improved.

Then, details of plasma treatment will be described with reference to FIG. 3. First, a treatment chamber is made to be in vacuum and a gas containing oxygen is introduced from a gas introduction source 65. In this embodiment mode, a mixed gas of oxygen ($O_2$) and argon (Ar) is introduced. Next, an insulating substrate 101 over which a metal film is formed is set on a support stand 64 having a heating system and heated to 400° C. A heating temperature may be in a range of 200 to 550° C. (preferably, 250° C. or higher). Spacing between the insulating substrate 101 and an antenna 62 is set to be in a range of 20 to 80 mm (preferably, 20 to 60 mm).

Subsequently, a microwave is supplied from a waveguide 60 to the antenna 62. In this embodiment mode, a microwave having frequency of 2.45 GHz is supplied. Then, the microwave is introduced from the antenna 62 to the treatment chamber through a dielectric plate 63 provided in the treatment chamber, and high-density plasma 66 in which the $O_2$ gas and the Ar gas are mixed is generated. Radicals, which are generated in the high-density plasma 66 in which the $O_2$ gas and the Ar gas are mixed, and a metal material over the substrate surface react with each other to form a metal oxide film over the substrate. In this embodiment mode, since aluminum is used as the metal material, an aluminum oxide film is formed. The $O_2$ gas and the Ar gas that are used in this step are exhausted from an exhaust port 67 to the outside of the treatment chamber. Since a region where the plasma 66 is generated and the insulating substrate 101 provided on the support stand 64 are apart from each other, a film is not damaged due to charging of electric charges on the film surface. Further, a shower plate provided with a plurality of holes through which plasma can pass may be provided between the insulating substrate 101 and the region where the plasma 66 is generated.

The plasma that is generated by using the apparatus shown in FIG. 3 has low electron temperatures (1.5 eV or lower, preferably 0.5 eV or higher and 1.5 eV or lower) and high electron density ($1.0 \times 10^{11}$ cm$^{-3}$ or higher, preferably $1.0 \times 10^{11}$ cm$^{-3}$ or higher and $1.0 \times 10^{13}$ cm$^{-3}$ or lower). Therefore, a dense metal oxide film with extremely small plasma damage can be formed at a low temperature.

It is to be noted that, in this embodiment mode, the manufacturing method of the semiconductor device of Embodiment Mode 1 by using the multi-chamber apparatus of FIG. 2 is described; however, the semiconductor devices of Embodiment Modes 2 and 3 can also be manufactured by using the multi-chamber apparatus of FIG. 2.

When the semiconductor device of Embodiment Mode 2 is manufactured, plasma oxidizing treatment is performed after performing plasma nitriding treatment in the second chamber 1112 to form a gate insulating film, which is formed of a metal oxide film containing nitrogen and a silicon oxide film and contains several % of nitrogen left at the surface. It is to be noted that, in the case of performing the plasma nitriding treatment, a raw material gas containing nitrogen may be used, and other conditions are the same as in the case of the plasma oxidizing treatment.

When the semiconductor device of Embodiment Mode 3 is manufactured, plasma nitriding treatment is performed after performing plasma oxidizing treatment in the second chamber 1112 to form a gate insulating film formed of a metal oxide film containing nitrogen and a silicon oxide film, in which approximately 20% of the metal oxide film at most is changed into a metal nitride film. It is to be noted that, in the case of performing the plasma nitriding treatment, a raw material gas containing nitrogen may be used, and other conditions are the same as in the case of the plasma oxidizing treatment.

Embodiment Mode 5

Figure 4A:
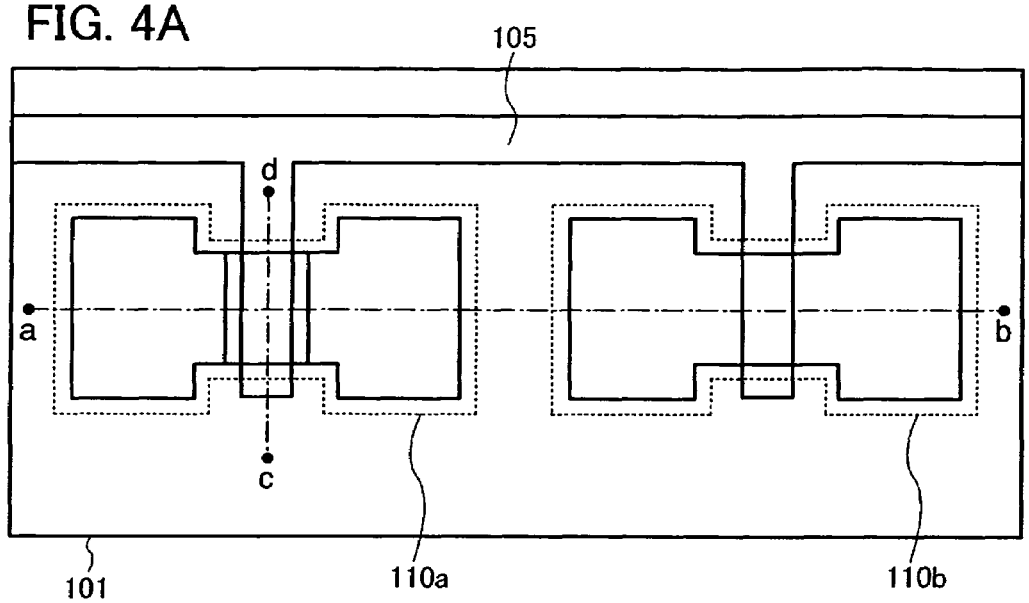
FIG. 4A is a plan view showing a semiconductor device according to Embodiment Mode 5.
Figure 4B:
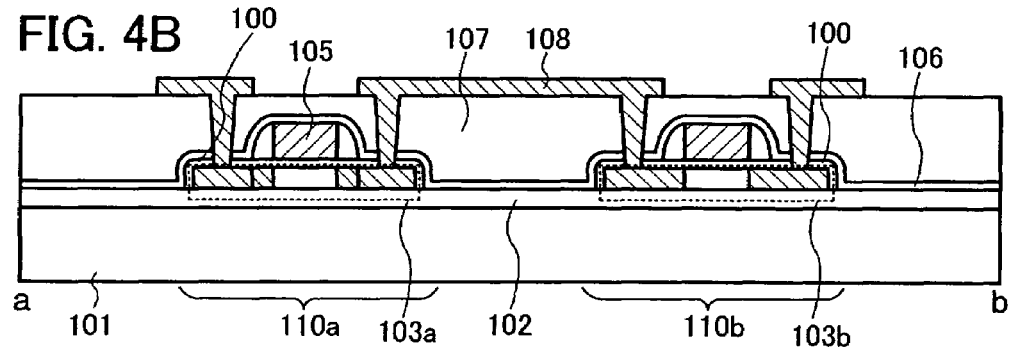
FIG. 4B is a cross-sectional view taken along a line a-b of FIG. 4A.

FIG. 4A is a plan view showing a semiconductor device according to Embodiment Mode 5 of the present invention. FIG. 4B is a cross-sectional view taken along a line a-b of FIG. 4A, and FIG. 4C is a cross-sectional view taken along a line c-d of FIG. 4A.

Figure 4C:
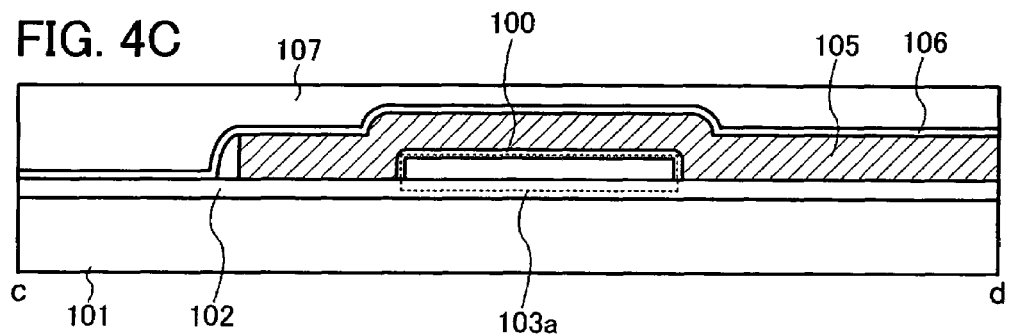
FIG. 4C is a cross-sectional view taken along a line c-d of FIG. 4A.

The semiconductor device shown in FIGS. 4A to 4C includes island-shaped polysilicon films 103a and 103b, which are semiconductor films provided over a substrate 101 with an insulating film 102 interposed therebetween; gate electrodes 105 provided over the polysilicon films 103a and 103b with gate insulating films 100 interposed therebetween; insulating films 106 and 107 provided to cover the gate electrodes; and conductive films 108 electrically connected to a source region or a drain region of the polysilicon films 103a and 103b and provided over the insulating film 107. The gate insulating film 100 has the same structure as that of the gate insulating film in any of Embodiment Modes 1 to 3. It is to be noted that FIGS. 4A to 4C show a case where an n-channel thin film transistor 110*a* using part of the polysilicon film 103*a* as a channel forming region and a p-channel thin film transistor 110*b* using part of the polysilicon film 103*b* as a channel forming region are provided.

The substrate 101 can be a glass substrate formed of glass such as barium borosilicate glass or alumino borosilicate glass, a quartz substrate, a ceramic substrate, a metal substrate containing stainless steel, or the like. In addition, a substrate formed of plastics typified by polyethylene terephthalate (PET), polyethylene naphthalate (PEN), or polyether sulfone (PES), or a substrate formed of a flexible synthetic resin such as acrylic can also be used. By using a flexible substrate, it is possible to manufacture a semiconductor device which can be bent. In addition, such a substrate has no strict limitations to an area or a shape thereof. Therefore, for example, when a substrate that is 1 meter or more on one side and rectangular is used as the substrate 101, productivity can be significantly enhanced. Such a merit is highly advantageous, as compared with a case of using a circular silicon substrate.

The insulating film 102 serves as a base insulating film and is provided so as to prevent alkali metal such as Na or alkaline earth metal from being dispersed from the substrate 101 into the polysilicon films 103*a* and 103*b*, thereby preventing characteristics of a semiconductor element from being adversely affected. The insulating film 102 can be provided by using a single layer structure of an insulating film containing oxygen or nitrogen such as a silicon oxide (SiOx) film, a silicon nitride (SiNx) film, a silicon oxynitride (SiOxNy) film (x>y), or a silicon nitride oxide (SiNxOy) film (x>y), or a stacked structure of these films. For example, when the insulating film 102 is provided by using a two-layer structure, an insulating film in a first layer may be provided using a silicon nitride oxide film, and an insulating film in a second layer may be provided using a silicon oxynitride film. In addition, when the insulating film 102 is provided by using a three-layer structure, an insulating film in a first layer may be provided using a silicon oxynitride film, an insulating film in a second layer may be provided using a silicon nitride oxide film, and an insulating film in a third layer may be provided using a silicon oxynitride film.

The polysilicon films 103*a* and 103*b* can be formed by using amorphous silicon or semi-amorphous silicon (SAS). SAS is a semiconductor having an intermediate structure between amorphous and crystalline (including single crystal and polycrystalline) structures and having a third state which is stable in free energy. Moreover, SAS includes a crystalline region with a short distance order and lattice distortion, and a crystal grain having a diameter of 0.5 to 20 nm can be observed at least in a portion of a film. The diffraction peaks of (111) and (220), which are believed to be derived from a silicon crystal lattice, are observed in X-ray diffraction. SAS contains hydrogen or halogen by at least 1 atomic % or more to terminate dangling bonds. SAS is formed by glow discharge decomposition (plasma CVD) of a gas containing silicon. As the gas containing silicon, $SiH_4$ as well as $Si_2H_6$, $SiH_2Cl_2$, $SiHCl_3$, $SiCl_4$, $SiF_2$ or the like can be used. Further, $GeF_4$ may be mixed. The gas containing silicon may be diluted with $H_2$, or $H_2$ and one or plural kinds of rare gas elements such as He, Ar, Kr, and Ne. The dilution ratio may be in a range of 2- to 1000-times, pressure may be in a range of approximately 0.1 to 133 Pa, and power supply frequency may be 1 to 120 MHz, preferably 13 to 60 MHz. A temperature for heating the substrate may be 300° C. or lower. It is preferable that a concentration of impurities of atmospheric components such as oxygen, nitrogen, and carbon be $1 \times 10^{20}$ $cm^{-1}$ or lower as impurity elements in the film. In particular, an oxygen concentration may be $5 \times 10^{19}/cm^{-3}$ or lower, preferably $1 \times 10^{19}/cm^{-3}$ or lower. Here, an amorphous silicon film is formed by a sputtering method, an LPCVD method, a plasma CVD method, or the like. The amorphous silicon film is crystallized by a known crystallization method such as a laser crystallization method, a thermal crystallization method using RTA or an annealing furnace, or a thermal crystallization method using a metal element which promotes crystallization. Further, as another crystallization method, thermal plasma may be generated by applying DC bias and the semiconductor film is crystallized by the action of the thermal plasma.

The gate insulating film 100 has the same structure as those in Embodiment Modes 1 to 3. In other words, the gate insulating film 100 may be formed of a silicon oxide film formed over the polysilicon film and a metal oxide film formed over the silicon oxide film. Alternatively, nitrogen may be contained in the surface of the metal oxide film.

The insulating film 106 can be provided by a sputtering method, a plasma CVD method, or the like using a single layer structure of an insulating film containing oxygen or nitrogen such as a silicon oxide (SiOx) film, a silicon nitride (SiNx) film, a silicon oxynitride (SiOxNy) film (x>y), or a silicon nitride oxide (SiNxOy) film (x>y), or a film containing carbon such as a DLC (diamond like carbon) film, or a stacked structure of these films.

The insulating film 107 can be provided by using a single layer structure of an organic material such as epoxy, polyimide, polyamide, polyvinyl phenol, benzocyclobutene, or acrylic, or a siloxane resin, in addition to an insulating film containing oxygen or nitrogen such as a silicon oxide (SiOx) film, a silicon nitride (SiNx) film, a silicon oxynitride (SiOxNy) film (x>y), or a silicon nitride oxide (SiNxOy) film (x>y), or a film containing carbon such as a DLC (diamond like carbon) film, or a stacked structure of these films. It is to be noted that a siloxane resin corresponds to a resin containing a Si—O—Si bond. Siloxane includes a skeleton structure of a bond of silicon (Si) and oxygen (O). As a substituent, an organic group containing at least hydrogen (such as an alkyl group or aromatic hydrocarbon) is used. Alternatively, a fluoro group can also be used as a substituent. Further alternatively, as a substituent, a fluoro group and an organic group containing at least hydrogen can be used. In addition, an oxazole resin, e.g. photosensitive polybenzoxazole can be used for the insulating film 107. Photosensitive polybenzoxazole has a low dielectric constant (a dielectric constant of 2.9 at 1 MHz and a normal temperature), high heat resistance, and a low water absorbing rate (0.3% in 24 hours at a normal temperature). The oxazole resin has a lower dielectric constant than that of polyimide and is more suitable for the insulating film. It is to be noted that, in the semiconductor device shown in FIGS. 4A to 4C, the insulating film 107 can also be directly provided so as to cover the gate electrode 105 without providing the insulating film 106.

The conductive film 108 can be provided by using a single layer structure or a stacked structure of an element such as Al, Ni, C, W, Mo, Ti, Pt, Cu, Ta, Au, or Mn, or alloy containing a plurality of the elements. For example, as a conductive film formed of alloy containing a plurality of the elements, Al alloy containing C and Ti, Al alloy containing Ni, Al alloy containing C and Ni, Al alloy containing C and Mn, or the like can be used. In addition, in a case of a stacked structure, the conductive film 108 can be provided by stacking Al and Ti.

Figure 5A:
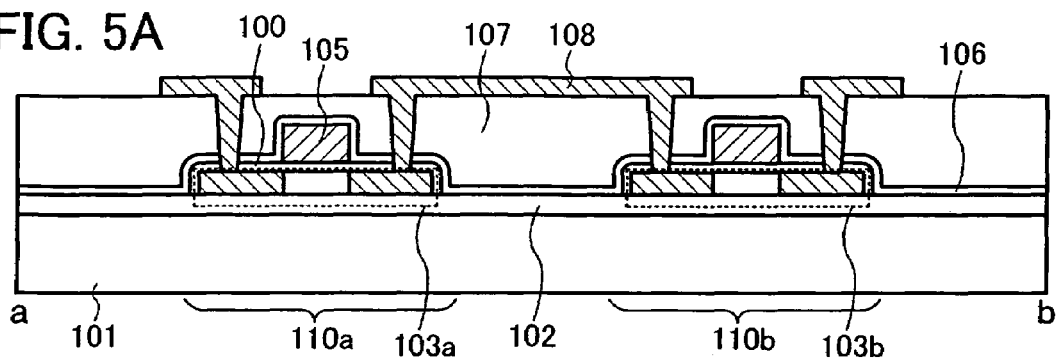
FIGS. 5A to 5C are cross-sectional views each showing a transformed example of a semiconductor device according to Embodiment Mode 5.

In FIGS. 4A to 4C, the n-channel thin film transistor 110*a* includes sidewalls in contact with side surfaces of the gate electrode 105. Further, a source region and a drain region which are selectively doped with an impurity imparting n-type conductivity and LDD regions which are provided below the sidewalls are formed in the polysilicon film 103a. In addition, the p-channel thin film transistor 110b includes sidewalls in contact with side surfaces of the gate electrode 105. Further, a source region and a drain region which are selectively doped with an impurity imparting p-type conductivity are formed in the polysilicon film 103b. It is to be noted that a structure of the thin film transistor included in the semiconductor device of the present invention is not limited to the above structure. For example, in FIGS. 4A to 4C, the n-channel thin film transistor 110a includes the LDD region and the p-channel thin film transistor 110b does not include an LDD region; however, it is also possible to have a structure in which both of the transistors include an LDD region, or neither of the transistors include an LDD region nor a sidewall (FIG. 5A).

Figure 5B:
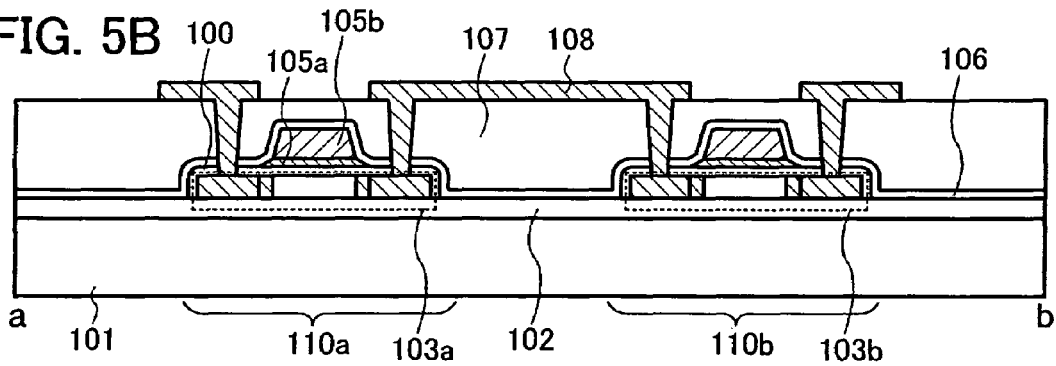
Figure 5C:
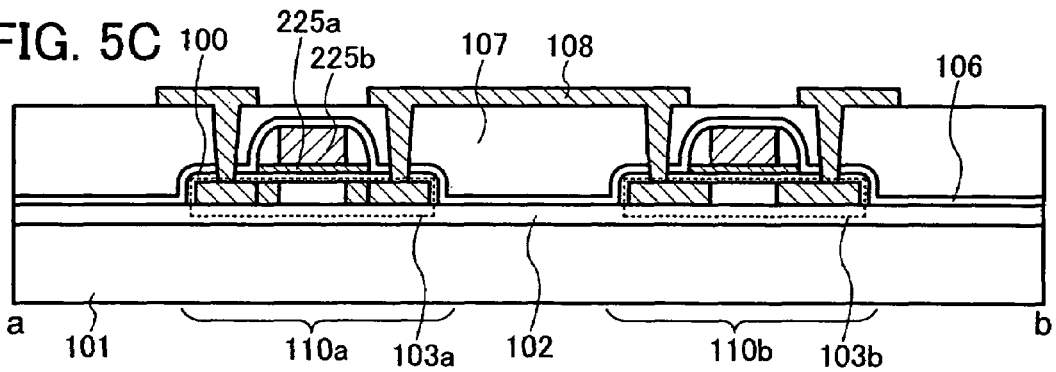

In addition, a structure of the thin film transistor is not limited to the above structure, and a single gate structure in which one channel forming region is formed, or a multi-gate structure such as a double gate structure in which two channel forming regions are formed or a triple gate structure in which three channel forming regions are formed can be employed. Further, a dual gate structure in which two gate electrodes are arranged above and below a channel forming region with a gate insulating film interposed therebetween may also be employed. In a case of providing the gate electrode using a stacked structure, the gate electrode can be provided using a first conductive film 105a formed in a lower layer of the gate electrode and a second conductive film 105b formed over the first conductive film 105a, and further, the first conductive film has a tapered shape, and impurity regions each having a lower concentration than in an impurity region serving as a source or drain region are provided so as to overlap only with the first conductive film (FIG. 5B). Further, in the case of providing the gate electrode using a stacked structure, the gate electrode can also be provided using a first conductive film 225a formed in a lower layer of the gate electrode and a second conductive film 225b formed over the first conductive film 225a, where sidewalls are provided so as to be in contact with the side surfaces of the second conductive film 225b and over the first conductive film 225a (FIG. 5C). It is to be noted that, in the above structure, an impurity region serving as a source or drain region of the polysilicon films 103a and 103b can also be provided using silicide of Ni, Co, W, or the like.

Hereinafter, a manufacturing method of a semiconductor device according to this embodiment mode will be described with reference to the drawings. First, as for an island-shaped polysilicon film provided over a substrate, a case of forming an edge portion of the island-shaped polysilicon film into a shape close to a right angle will be described with reference to FIGS. 6A to 6D.

Figure 6A:
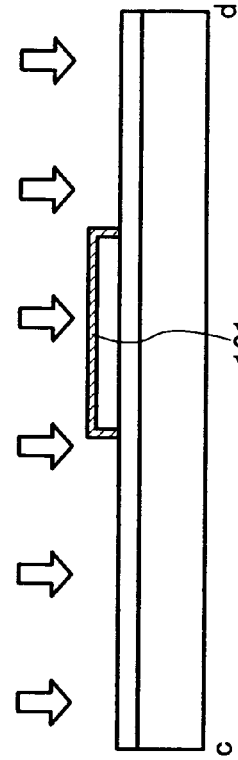
FIGS. 6A to 6D are cross-sectional views each showing a manufacturing method of a semiconductor device according to Embodiment Mode 5.

First, island-shaped polysilicon films 103a and 103b are formed over a substrate 101 by the same method as in Embodiment Mode 1 (FIG. 6A). It is to be noted that, in FIGS. 6A to 6D, edge portions of the island-shaped polysilicon films 103a and 103b are each formed into a shape close to a right angle ($85° \leq \theta \leq 100°$).

The polysilicon films 103a and 103b are obtained by performing laser crystallization to an amorphous semiconductor film. This laser crystallization will be described in detail hereinafter. In a case of using laser irradiation, a continuous wave oscillation laser beam (a CW laser beam) or a pulsed oscillation laser beam (a pulsed laser beam) can be used. As a laser beam that can be used here, a laser beam emitted from one or more kinds of a gas laser such as an Ar laser, a Kr laser, or an excimer laser; a laser using, as a medium, single crystal YAG, YVO$_4$, forsterite (Mg$_2$SiO$_4$), YAlO$_3$, or GdVO$_4$, or polycrystal (ceramic) YAC; Y$_2$O$_3$, YvO$_4$, YAlO$_3$, or GdVO$_4$ doped with one or more kinds of Nd, Yb, Cr, Ti, Ho, Er, Tm, and Ta as a dopant; a glass laser; a ruby laser; an alexandrite laser; a Ti: sapphire laser; a copper vapor laser; and a gold vapor laser can be given. By irradiation of the fundamental waves of such a laser beam or the second harmonic to the fourth harmonic laser beam of these fundamental waves, large grain crystal can be obtained. For example, the second harmonic (532 nm) or the third harmonic (355 nm) of an Nd:YVO$_4$ laser (fundamental wave: 1064 nm) can be used. As for this laser, either continuous wave oscillation or pulsed oscillation can be performed. In a case of continuous wave oscillation, the power density of the laser needs to be approximately 0.01 to 100 MW/cm$^2$ (preferably, 0.1 to 10 MW/cm$^2$). Then, irradiation is carried out at a scanning rate of approximately 10 to 2000 cm/sec.

Further, a laser using, as a medium, single crystal YAG, YVO$_4$, forsterite (Mg$_2$SiO$_4$), YAlO$_3$, or GdVO$_4$, or polycrystal (ceramic) YAG, Y$_2$O$_3$, YVO$_4$, YAlO$_3$, or GdVO$_4$ doped with one or more kinds of Nd, Yb, Cr, Ti, Ho, Er, Tm and Ta as a dopant; an Ar ion laser; or a Ti: sapphire laser can perform continuous wave oscillation. In addition, pulsed oscillation at a repetition rate of 10 MHz or higher is also possible by carrying out Q-switch operation, mode locking, or the like. When pulsed oscillation of a laser beam at a repetition rate of 10 MHz or higher is carried out, the semiconductor film is irradiated with the next pulse after melting of the semiconductor film by a laser and before solidification thereof. Accordingly, differing from a case of using a pulsed laser with a lower repetition rate, the solid-liquid interface can be continuously moved in the semiconductor film, and a crystal grain grown continuously toward the scanning direction can be obtained.

The use of ceramic (polycrystal) as a medium allows the medium to be formed into a free shape at low cost in a short time. Although a columnar medium of several mm in diameter and several tens of mm in length is usually used in the case of using single crystal, larger mediums can be formed in the case of using ceramic.

Since the concentration of the dopant such as Nd or Yb in the medium, which directly contributes to light emission, cannot be changed significantly both in single crystal and polycrystal, improvement in laser output by increasing the concentration of the dopant has a certain level of limitation. However, in the case of ceramic, drastic improvement in output can be expected because the size of the medium can be significantly increased as compared with the case of single crystal.

Further, in the case of using ceramic, a medium having a parallelepiped shape or a rectangular parallelepiped shape can be easily formed. When a medium having such a shape is used and oscillation light goes in zigzag in the medium, an oscillation light path can be longer. Accordingly, amplification is increased and oscillation with high output is possible. Since a laser beam emitted from the medium having such a shape has a cross section of a quadrangular shape when being emitted, a linear beam can be easily shaped as compared with the case of a circular beam. The laser beam emitted in such a manner is shaped by using an optical system; accordingly, a linear beam having a short side of 1 mm or less and a long side of several mm to several m can be easily obtained. In addition, by uniformly irradiating the medium with excited light, an energy distribution of a linear beam becomes uniform in a long side direction.

By irradiating the semiconductor film with this linear beam, the entire surface of the semiconductor film can be annealed more uniformly. In a case where uniform annealing is required from one end to the other end of the linear beam, slits may be provided for the both ends so as to shield a portion where energy is attenuated.

Figure 6B:
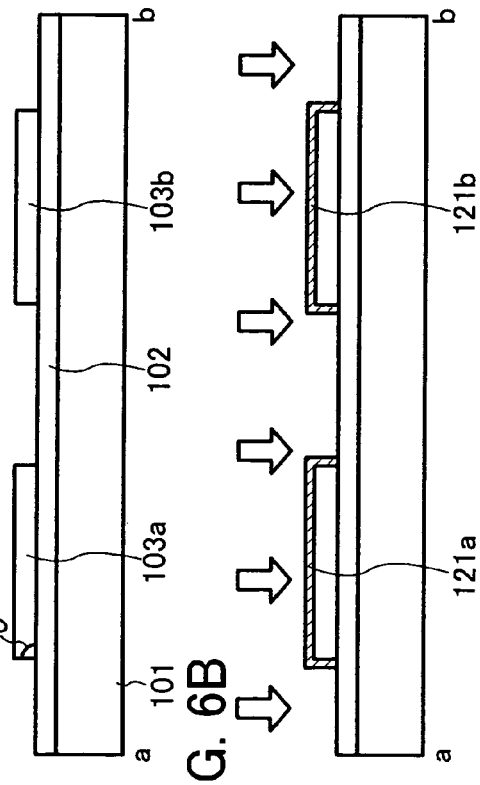

Subsequently, in the same manner as in Embodiment Mode 1, aluminum films 121a and 121b are formed over the island-shaped polysilicon films 103a and 103b respectively by an MOCVD method (FIG. 6B).

Figure 6C:
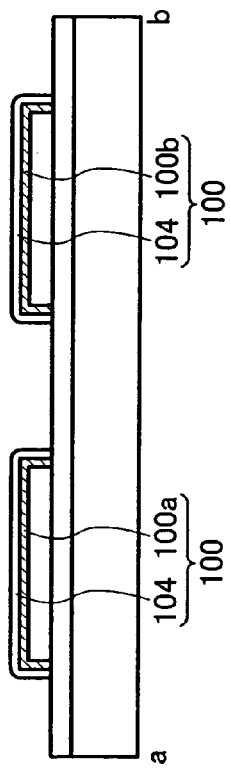

Then, plasma treatment is performed to the aluminum films 121a and 121b in an atmosphere containing oxygen to form aluminum oxide films 104, each of which is a metal oxide film. Further, plasma treatment is performed to the aluminum oxide films 104 in an atmosphere containing oxygen to form silicon oxide films 100a and 100b each having a thickness of approximately 0.5 to 1 nm between the polysilicon film 103a and the aluminum oxide film 104 and between the polysilicon film 103b and the aluminum oxide film 104 (FIG. 6C). Accordingly, gate insulating films 100 formed of the aluminum oxide films 104 and the silicon oxide films 100a and 100b are formed over the polysilicon films 103a and 103b. A thickness of the gate insulating film is the same as that in Embodiment Mode 1. It is to be noted that the same gate insulating film as that in Embodiment Mode 1 is formed here; however, the same gate insulating film as that in Embodiment Mode 2 or 3 can also be formed.

Figure 6D:
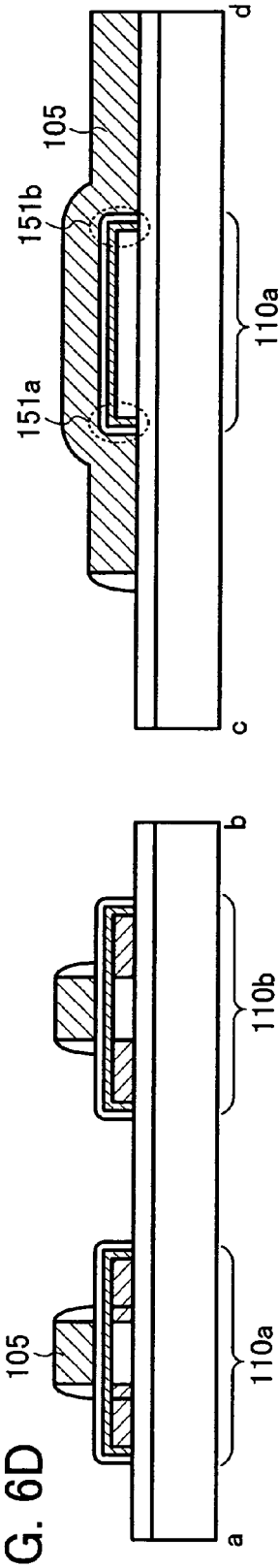

Next, by forming gate electrodes 105 and the like over the gate insulating films 100, a semiconductor device having an n-channel thin film transistor 110a and a p-channel thin film transistor 100b using the island-shaped polysilicon films 103a and 103b as channel forming regions can be manufactured (FIG. 6D).

As described above, since the silicon oxide films 100a and 100b are formed over the surfaces of the polysilicon films 103a and 103b respectively, a short-circuit between the gate electrode and the polysilicon film due to a coverage defect of the gate insulating film 100 in edge portions 151a and 151b of the channel forming region, or the like, can be prevented. In other words, in a case where the edge portion of the island-shaped polysilicon film has a shape close to a right angle (85°≦θ≦100°), there is a concern that a problem of a coverage defect due to disconnection of the gate insulating film, or the like, is caused in the edge portion of the poysilicon film when the gate insulating film is formed to cover the polysilicon film by a CVD method, a sputtering method, or the like. However, by forming the silicon oxide films 100a and 100b over the surfaces of the polysilicon films, a coverage defect of the gate insulating film, or the like, in the edge portion of the polysilicon film can be prevented.

Embodiment Mode 6

A manufacturing method of a liquid crystal display (LCD) device according to Embodiment Mode 6 of the present invention will be described with reference to FIGS. 7, 8, 9, 10A to 10D, and 11A and 11B.

A manufacturing method of a display device described in this embodiment mode is a method for manufacturing a pixel portion including a pixel TFT and a TFT of a driver circuit portion provided in the periphery of the pixel portion at the same time. It is to be noted that, in order to simplify the description, a CMOS circuit which is a basic unit is illustrated as for a driver circuit.

First, steps of forming components up to TFTs in FIG. 7 are carried out. A gate insulating film of the TFT is the same as any of those described in Embodiment Modes 1 to 3. It is to be noted that, in this embodiment mode, a pixel TFT 552 is a multi-gate TFT.

After forming an interlayer insulating film 17 of FIG. 7, a planarizing film which is to be a second interlayer insulating film 19 is formed.

Next, a resist mask is formed over the second interlayer insulating film 19. By etching the second interlayer insulating film 19 and the interlayer insulating film 17 with the use of this resist mask, contact holes are formed over a source region and a drain region, respectively.

After removing the resist mask and forming a conductive film, another resist mask is used to perform etching, and electrodes or wirings 540 to 544 (a source wiring and a drain wiring of a TFT, or the like) are formed. As the conductive film, a stacked film of titanium nitride, Al, and titanium nitride; an Al alloy film; or the like can be used.

Here, it is preferable to lead the electrodes or the wirings so that a corner is round when seen from a perpendicular direction to the substrate. By forming the corner to be round, dusts or the like are prevented from being left in the corner of the wiring, and a defect caused by dusts can be suppressed and the yield can be improved. A mask, which is manufactured by exposure and development using a photosensitive resist as a photomask, is used in patterning. Transmittance of light by which exposure is performed is suppressed in an arbitral portion of the photomask, and a thickness of the mask after development can be controlled. By controlling the thickness of the mask, finer and more precise patterning can be performed.

Subsequently, a third interlayer insulating film 610 is formed over the second interlayer insulating film 19 and the electrodes or the wirings 540 to 544. It is to be noted that the third interlayer insulating film 610 can be formed by using the same material as that of the second interlayer insulating film 19.

Then, a resist mask is formed by using a photomask, and part of the third interlayer insulating film 610 is removed by dry etching to form a contact hole. When this contact hole is formed, carbon tetrafluoride ($CF_4$), oxygen ($O_2$), or helium (He) is used as an etching gas. It is to be noted that a bottom of the contact hole reaches the electrode or the wiring 544.

After removing the resist mask, a second conductive film is formed over the entire surface. Then, the second conductive film is patterned by using a photomask, and a pixel electrode 623 electrically connected to the electrode or the wiring 544 is formed (FIG. 7). When a reflective type liquid crystal display panel is manufactured, the pixel electrode 623 may be formed using a metal material having light reflectivity such as Ag (silver), Au (gold), Cu (copper), W (tungsten), or Al (aluminum) by a sputtering method.

In addition, when a transmission type liquid crystal display panel is manufactured, a transparent conductive film such as indium tin oxide (ITO), indium tin oxide containing silicon oxide, zinc oxide (ZnO), or tin oxide ($SnO_2$) is used to form the pixel electrode 623.

Figure 8:
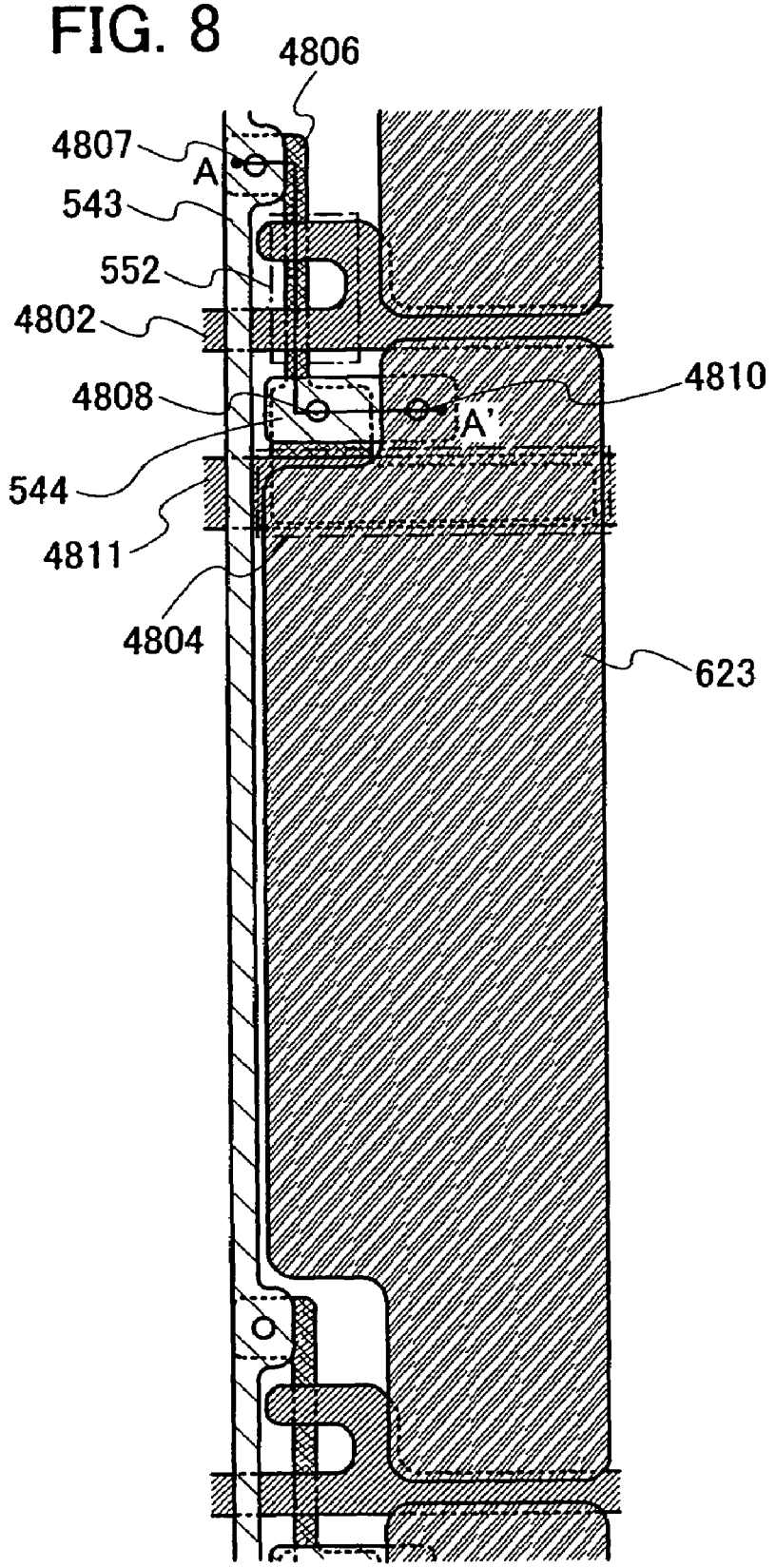
FIG. 8 is a plan view explaining a manufacturing method of a liquid crystal display device according to Embodiment Mode 6.

FIG. 8 shows a top view in which part of a pixel portion including a pixel TFT is enlarged. In addition, FIG. 7 shows a process of forming a pixel electrode, and a pixel electrode is formed in a right-hand pixel whereas a pixel electrode is not formed in a left-hand pixel. A view taken along a solid line A-A' of FIG. 8 corresponds to a cross-sectional view of a pixel portion in FIG. 7, and the same reference numerals are used for portions corresponding to FIG. 7.

A pixel is provided in an intersection of a source signal line 543 and a gate signal line 4802, and includes a transistor 552, a capacitor element 4804, and a liquid crystal element. It is to be noted that only one electrode (a pixel electrode 623) of a pair of electrodes which drive a liquid crystal of the liquid crystal element is shown in the drawing.

The transistor 552 includes a semiconductor layer 4806, a first insulating layer, and part of the gate signal line 4802 overlapped with the semiconductor layer 4806 with the first insulating layer interposed therebetween. The semiconductor layer 4806 serves as an active layer of the transistor 552. The first insulating layer serves as a gate insulating layer of the transistor. One of a source and a drain of the transistor 552 is connected to the source signal line 543 through a contact hole 4807, and the other is connected to a connecting wiring 544 through a contact hole 4808. The connecting wiring 544 is connected to the pixel electrode 623 through a contact hole 4810. In addition, the connecting wiring 544 can be formed at the same time as the source signal line 543 by patterning a conductive layer, which is also used for forming the source signal line 543.

The capacitor element 4804 is a capacitor element having a structure using the semiconductor layer 4806 and a capacitor wiring 4811 overlapped with the semiconductor layer 4806 with a first insulating layer interposed therebetween as a pair of electrodes, and the first insulating layer as a dielectric layer (referred to as a first capacitor element). It is to be noted that the capacitor element 4804 may also have a structure using the capacitor wiring 4811 and the pixel electrode 623 overlapped with the capacitor wiring 4811 with a second insulating layer interposed therebetween as a pair of electrodes, and the second insulating layer as a dielectric layer (referred to as a second capacitor element). Since the second capacitor element is connected in parallel to the first capacitor element, capacitance value of the capacitor element 4804 can be increased by providing the second capacitor element. Further, the capacitor wiring 4811 can be formed at the same time as the gate signal line 4802 by patterning a conductive layer, which is also used for forming the gate signal line 4802.

A pattern of the semiconductor layer 4806, the gate signal line 4802, the capacitor wiring 4811, the source signal line 543, the connecting wiring 544, and the pixel electrode 623 has a shape of which a corner is chamfered by a length of 10 μm or shorter on one side. A mask pattern is formed using this photomask pattern, and patterning is performed by using the mask pattern, thereby forming a shape of which a corner is chamfered. It is to be noted that the corner may be further rounded. In other words, by setting an exposure condition and an etching condition appropriately, a pattern shape may be smoothed more than the photomask pattern.

When a corner of a bent portion or a portion where the wiring width changes is smoothed and rounded in a wiring and an electrode, there is the following effect. When dry etching using plasma is performed, generation of fine particles due to abnormal discharge can be suppressed by chamfering a convex portion. Even though the fine particles are generated, the fine particles can be prevented from accumulating in the corner at the time of cleaning and the fine particles can be washed away by chamfering a concave portion. Thus, a problem of dusts or fine particles in a manufacturing process can be solved and the yield can be improved.

Through the above steps, a TFT substrate of a liquid crystal display device, over which a top gate pixel TFT 552, a CMOS circuit 553 including top gate TFTs 550 and 551, and the pixel electrode 623 are formed, is completed.

Figure 9:
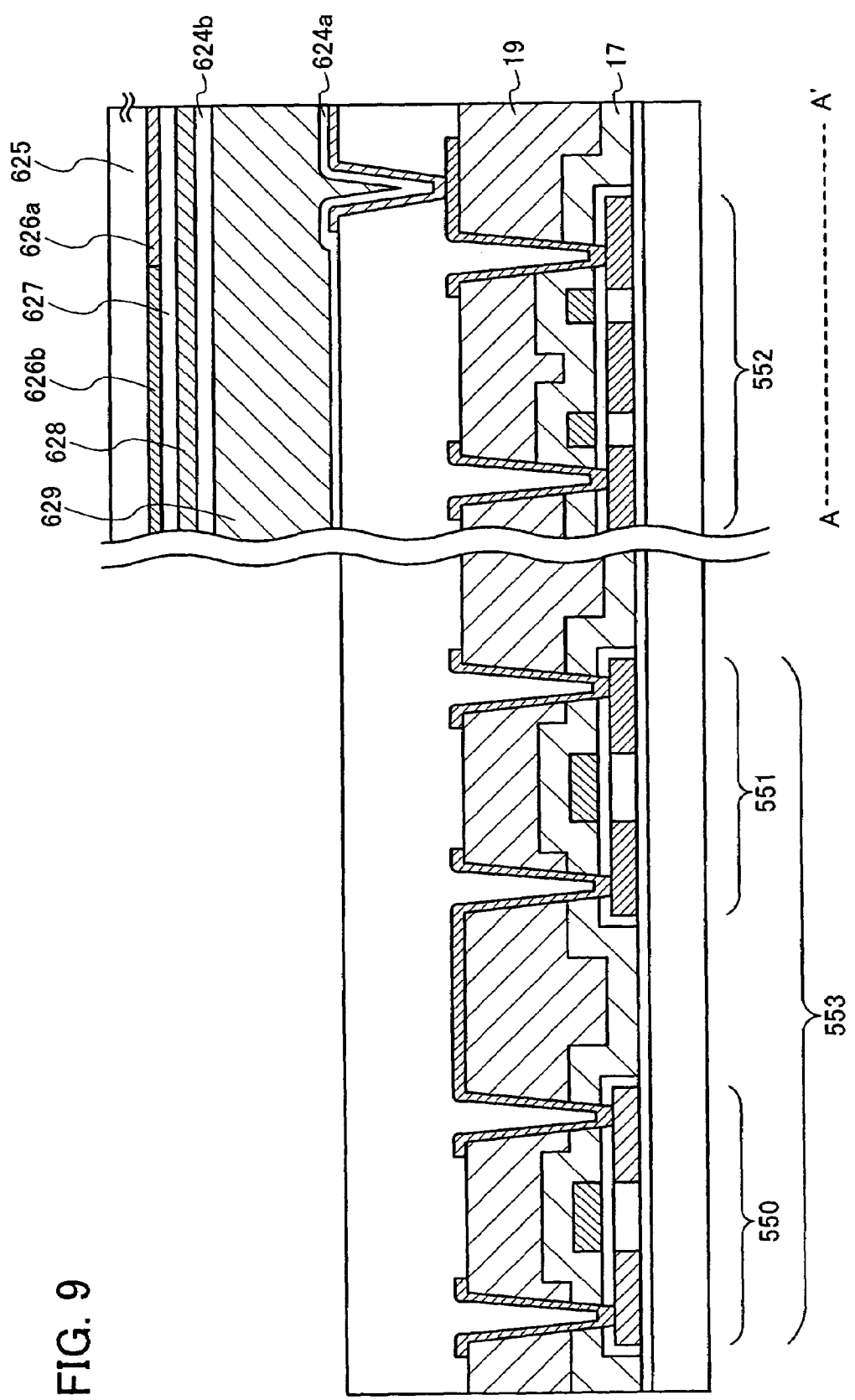
FIG. 9 is a cross-sectional view explaining a manufacturing method of a liquid crystal display device according to Embodiment Mode 6.
Figure 10A:
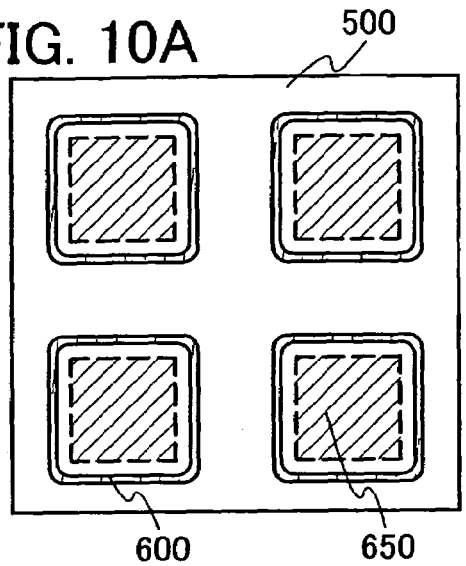
FIGS. 10A to 10D are plan views each explaining a manufacturing method of a liquid crystal display device according to Embodiment Mode 6.
Figure 10B:
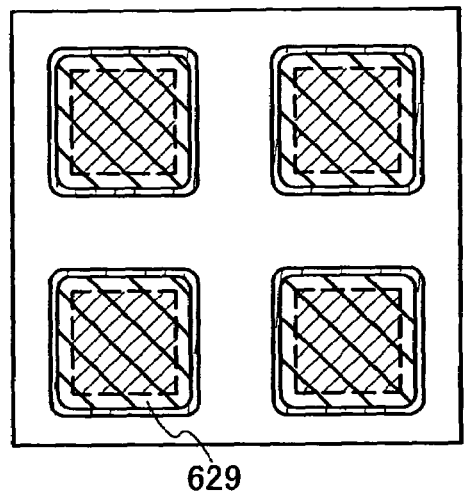

Subsequently, an orientation film 624*a* is formed so as to cover the pixel electrode 623. It is to be noted that the orientation film 624*a* may be formed by using a droplet-discharging method, a screen printing method, or an offset printing method. Thereafter, rubbing treatment is performed to the surface of the orientation film 624*a*. Over an opposing substrate 625, a color filter including a colored layer 626*a*, a light-shielding layer (black matrix) 626*b*, and an overcoat layer 627 is provided, an opposing electrode 628 formed of a transparent electrode or a reflective electrode is provided, and an orientation film 624*b* is provided thereover (FIG. 9). Then, a sealing material 600 that is a closed pattern is formed so as to surround a region overlapped with a pixel portion 650 including a pixel TFT by a droplet-discharging method (FIG. 10A). Here, an example of drawing the sealing material 600 that is a closed pattern is shown to drop a liquid crystal; however, a dipping method (a pumping method) may also be used, in which a sealing pattern having an opening is provided, and a liquid crystal is injected by using a capillary phenomenon after attaching a substrate 500 to the opposing substrate 625.

Figure 10C:
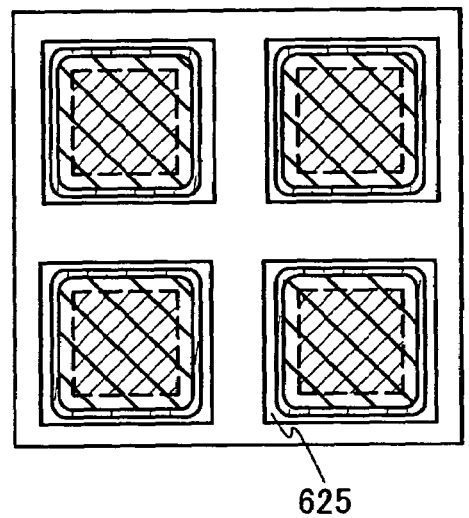

Then, a liquid crystal composition 629 is dropped under reduced pressure so that bubbles are not mixed (FIG. 10B), and both the substrates 500 and 625 are attached to each other (FIG. 10C). A liquid crystal is dropped once or plural times in a sealing pattern of the closed loop. As an orientation mode of the liquid crystal composition 629, a TN mode is used, in which the arrangement of liquid crystal molecules is twisted at 90° from where light enters toward where light is emitted. The substrates are attached to each other in such a manner that the rubbing directions thereof are orthogonal to each other.

The distance between a pair of the substrates may be kept by dispersing a spherical spacer or forming a columnar spacer formed of a resin, or by mixing filler in the sealing material 600. The aforementioned columnar spacer is formed of an organic resin material containing, as its main component, at least one of acrylic, polyimide, polyimide amide, and epoxy, or an inorganic material such as one of silicon oxide, silicon nitride, and silicon oxide containing nitrogen, or a stacked film thereof.

Figure 10D:
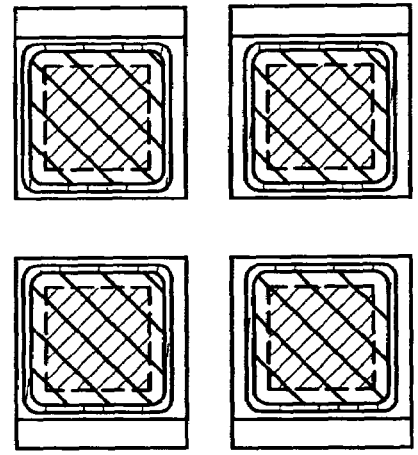

Then, the substrate is sectioned. In a case of obtaining a number of panels from one substrate, the substrate is sectioned into a number of panels. On the other hand, in a case of obtaining one panel from one substrate, a sectioning step can be omitted by attaching an opposing substrate which is cut in advance to the substrate (FIG. 9 and FIG. 10D).

Then, an FPC (Flexible Printed Circuit) is attached through an anisotropic conductive layer using a known technique. Through the above steps, a liquid crystal display device is completed. In addition, an optical film is attached as needed. In the case of a transmission type liquid crystal display device, a polarizing plate is attached to each of the TFT substrate and the opposing substrate.

Figure 11A:
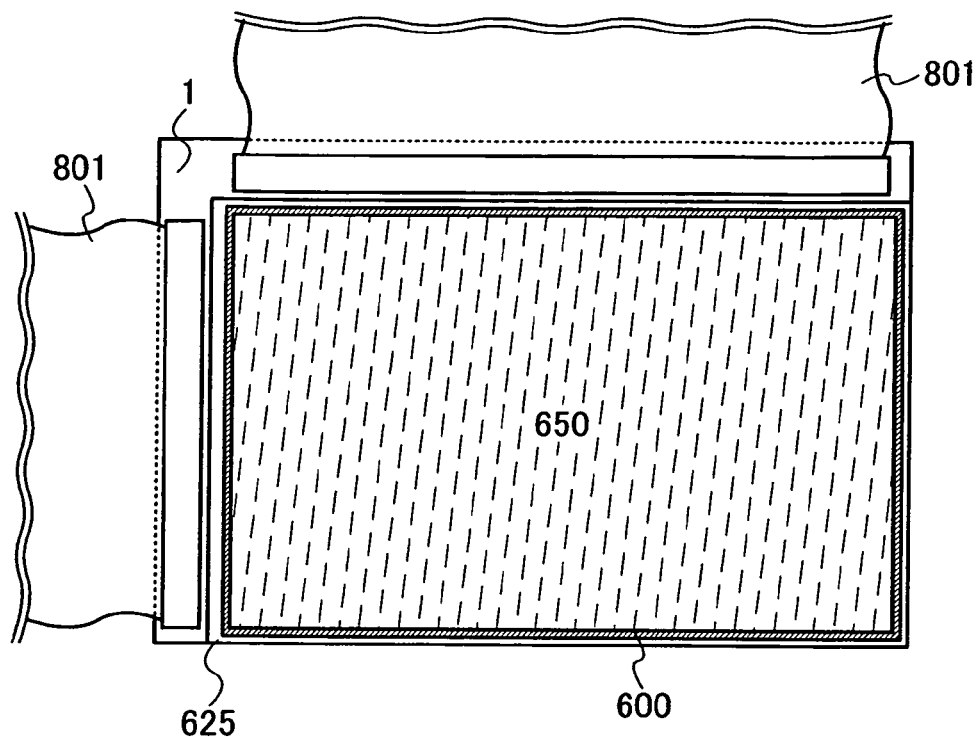
FIGS. 11A and 11B are plan views each explaining a manufacturing method of a liquid crystal display device according to Embodiment Mode 6.
Figure 11B:
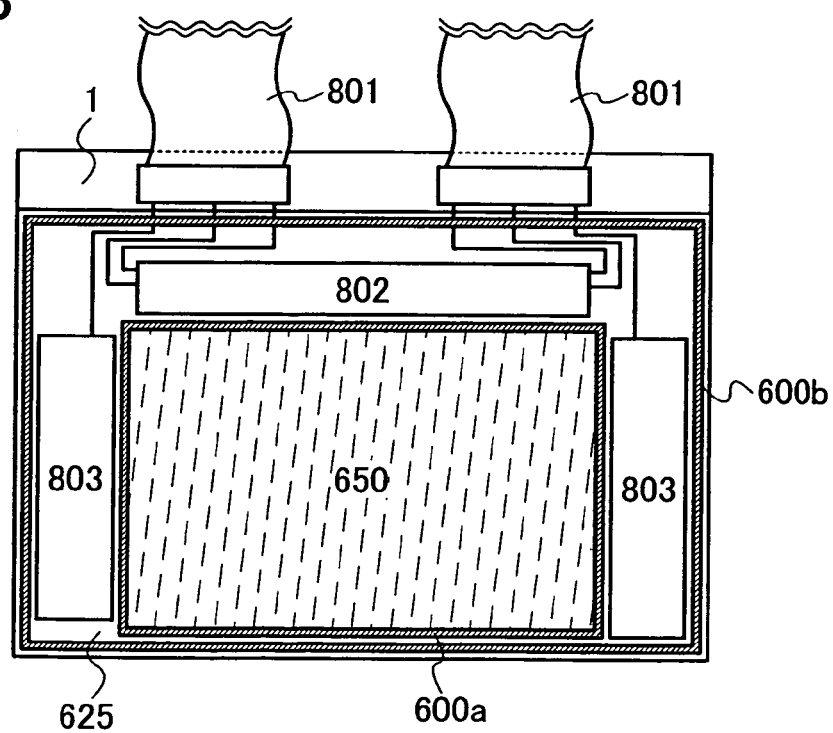

FIG. 11A shows a top view of a liquid crystal display device obtained through the aforementioned steps, and FIG. 11B shows an example of a top view of another liquid crystal display device.

In FIG. 11A, reference numeral 1 denotes a TFT substrate; 625, an opposing substrate; 650, a pixel portion; 600, a sealing material; and 801, an FPC. It is to be noted that a liquid crystal composition is discharged by a droplet discharging method, and the substrates 500 and 625 are attached to each other under reduced pressure with the sealing material 600.

In FIG. 11B, reference numeral 1 denotes a TFT substrate; 625, an opposing substrate; 802, a source signal line driver circuit; 803, a gate signal line driver circuit; 650, a pixel portion; 600*a*, a first sealing material; and 801, an FPC. It is to be noted that a liquid crystal composition is discharged by a droplet discharging method, and the substrates 500 and 625 are attached to each other with the first sealing material 600*a* and a second sealing material 600*b*. Since the liquid crystal is not necessary in the driver circuit portions 802 and 803, the liquid crystal is provided only in the pixel portion 650, and the second sealing material 600*b* is provided for reinforcement of the entire panel.

It is to be noted that the liquid crystal display device manufactured in this embodiment mode can be used as a display portion of various electronic devices.

In addition, the TFT is not limited to a multi-gate structure and may be a single gate structure. Further, this embodiment mode can be freely combined with any description of the above embodiment modes as needed.

Embodiment Mode 7

An RFID tag according to Embodiment Mode 7 of the present invention will be described with reference to FIGS. 12A and 12B, 13A to 13D, 14A and 14B, 15A to 15C, 16A to 16C, 17A to 17C, and 18A to 18H. More specifically, one example of a semiconductor device which has a memory element and can transmit and receive data without contact will be described.

Figure 12A:
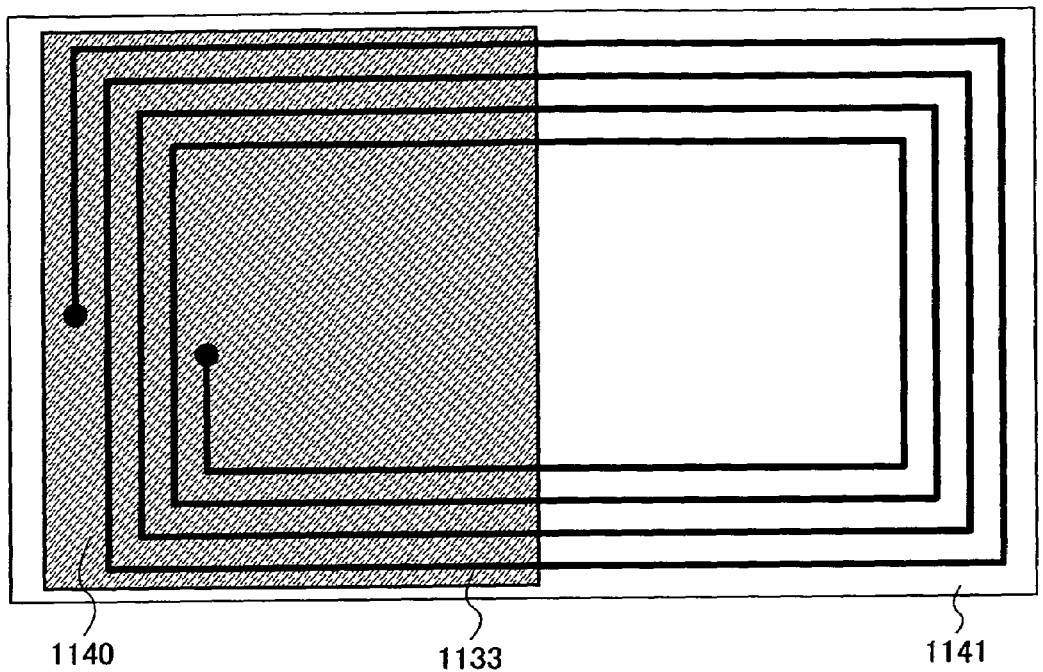
FIG. 12A is a plan view showing a semiconductor device according to Embodiment Mode 7.

In the semiconductor device shown in this embodiment mode, a semiconductor element 1140 including a plurality of thin film transistors and a conductive film 1133 serving as an antenna are provided over a substrate 1141 as shown in FIG. 12A. The conductive film 1133 serving as an antenna is electrically connected to the thin film transistors included in the semiconductor element 1140. In addition, the semiconductor device can transmit and receive data to/from an external device (reader/writer) without contact via the conductive film 1133 serving an antenna.

Figure 12B:
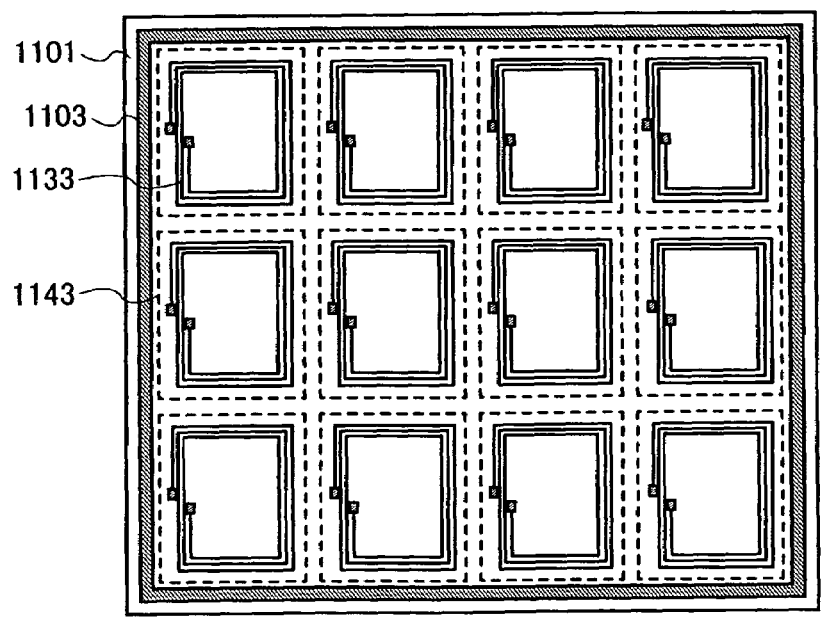
FIG. 12B is a plan view explaining a manufacturing method of a semiconductor device according to Embodiment Mode 7.

Hereinafter, an example of a manufacturing method of the semiconductor device will be described with reference to the drawings. As shown in FIG. 12B, a case is described, where a plurality of semiconductor devices 1143 (here, 12 pieces=3×4) is manufactured from one substrate 1101. Here, in order to form a flexible semiconductor device, after a semiconductor element such as a thin film transistor and an antenna are once provided over a rigid substrate 1101 such as glass with a peeling layer 1103 interposed therebetween, the semiconductor element, the antenna, and the like are peeled from the substrate 1101, and the semiconductor element, the antenna, and the like are provided over a flexible substrate.

First, an insulating film 1102 and a peeling layer 1103 are formed over a substrate 1101 (FIG. 13A)

As the substrate 1101, the same material as that of the substrate 101 mentioned above can be used. Here, a glass substrate is used as the substrate 1101.

The insulating film 1102 can be provided by using a single layer structure of an insulating film containing oxygen or nitrogen such as a silicon oxide ($SiO_x$) film, a silicon nitride ($SiN_x$) film, a silicon oxynitride ($SiO_xN_y$) film (x>y), or a silicon nitride oxide ($SiN_xO_y$) film (x>y), or a stacked structure of these films. Here, a glass substrate is used as the substrate 1101, and silicon oxynitride is formed to have a thickness of 50 to 150 nm as the insulating film 1102.

As the peeling layer 1103, a metal film, a stacked structure of a metal film and a metal oxide film, or the like can be used. The metal film can be formed by using a single layer structure of an element such as tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or an alloy material or a compound material containing the element as its main component, or a stacked structure thereof. In addition, such materials can be formed by a sputtering method or various CVD methods such as a plasma CVD method. As for the stacked structure of a metal film and a metal oxide film, after forming a metal film as described above, plasma treatment in an atmosphere containing oxygen and heat treatment in an atmosphere containing oxygen are performed to provide oxide of the metal film over the surface of the metal film. For example, in a case where a tungsten film is formed by a sputtering method as the metal film, by performing plasma treatment to the tungsten film, a metal oxide film formed of tungsten oxide can be formed over the surface of the tungsten film. In this case, tungsten oxide is expressed as $WO_x$ where x is 2 to 3, and there are a case where x is 2 ($WO_2$), a case where x is 2.5 ($W_2O_5$), a case where x is 2.75 ($W_4O_{11}$), a case where x is 3 ($WO_3$), and the like. When forming the tungsten oxide, the value of x is not particularly limited, and which oxide is to be formed may be determined depending on an etching rate and the like. In addition to the metal oxide film, metal nitride or metal oxynitride may be used. In this case, plasma treatment or heat treatment may be performed to the above metal film in an atmosphere containing nitrogen or an atmosphere containing nitrogen and oxygen. Further, as another method, after forming a metal film, an insulating film is formed over the metal film by a sputtering method in an atmosphere containing oxygen, thereby providing a stacked structure of a metal oxide film and the insulating film over the surface of the metal film. Moreover, after forming a metal film, it is also possible to provide a metal oxide film over the surface of the metal film by sputtering using metal as a target in an atmosphere containing oxygen. In this case, the metal film and the metal oxide film can be formed of different metal elements. It is to be noted that these methods also allow metal nitride or metal oxynitride to be formed over the metal film by sputtering in an atmosphere containing nitrogen or an atmosphere containing nitrogen and oxygen.

An insulating film 1104 serving as a base film is formed over the peeling layer 1103. Then, an amorphous silicon film which is an amorphous semiconductor film is formed over the insulating film 1104, and crystallization is performed to the amorphous silicon film by a laser crystallization method, a thermal crystallization method using RTA or an annealing furnace, a thermal crystallization method using a metal element promoting crystallization, a method combining such methods, or the like; thus, a polysilicon film 1105 which is a crystalline semiconductor film is formed (FIG. 13B).

The insulating film 1104 is a base film. As the base film 1104, after forming silicon nitride oxide ($SiN_xO_y$) (x>y), plasma treatment is performed to the silicon nitride oxide film in an atmosphere containing nitrogen, and the surface of the silicon nitride oxide film is nitrided. Thereafter, silicon oxynitride ($SiO_xN_y$) (x>y) is formed over the silicon nitride oxide film to obtain a stacked structure. In general, a silicon nitride oxide film formed by a CVD method or a sputtering method has defects inside and insufficient film quality. Thus, by nitriding the film by plasma treatment in an atmosphere containing nitrogen, the surface of the silicon nitride oxide film can be modified and a dense film can be formed. Consequently, when a semiconductor element is provided over the insulating film 1104, it is possible to prevent an impurity element from the substrate 1101 or the peeling layer 1103 from mixing into the semiconductor element.

Subsequently, the polysilicon film 1105 is doped with an impurity element imparting p-type conductivity. Here, boron (B) is added as the impurity element (FIG. 13C).

Then, the polysilicon film 1105 is selectively etched to form first to fourth semiconductor films 1106 to 1109 (FIG. 13D). Here, the first semiconductor film 1106 and the second semiconductor film 1107 are used for a memory element portion, and the third semiconductor film 1108 and the fourth semiconductor film 1109 are used for a logic circuit.

Next, after a resist mask 1210 is formed so as to cover the first semiconductor film 1116, the second to fourth semiconductor films 1107 to 1109 are each doped with an impurity element imparting p-type conductivity (FIG. 14A). In this embodiment mode, boron (B) is added as the impurity element.

The resist mask 1210 is removed, and gate insulating films 1223 are formed over the first to fourth semiconductor films 1106 to 1109 by the same method as any of those in Embodiment Modes 1 to 3. The gate insulating film 1223 is formed of a silicon oxide film 1221 formed over the semiconductor film and a metal oxide film 1222 formed over the silicon oxide film 1221.

Conductive films 1226 to 1229 each serving as a gate electrode are formed over the first to fourth semiconductor films 1106 to 1109 respectively (FIG. 15A). It is to be noted that the conductive films 1226 to 1229 are provided by using stacked structures of first conductive films 1226a to 1229a and second conductive films 1226b to 1219b. Here, tantalum nitride is used for the first conductive films 1226a to 1229a, and tungsten is used for the second conductive films 1226b to 1229b to obtain the stacked structures. A single layer structure may also be employed without being limited to these structures. In addition, the material is not limited thereto, and an element such as tantalum (Ta), tungsten (W), titanium (Ti), molybdenum (Mo), aluminum (Al), copper (Cu), chromium (Cr), or niobium (Nb), or an alloy material or a compound material containing the element as its main component can also be used. In addition, a semiconductor material typified by polycrystal silicon doped with an impurity element such as phosphorus can be used.

Subsequently, the first semiconductor film 1106 is doped with an impurity element imparting p-type conductivity using the conductive film 1226 as a mask, and the second to fourth semiconductor films 1107 to 1109 are each doped with an impurity element imparting n-type conductivity using the conductive films 1227 to 1229 as masks to form source or drain regions. Thereafter, an insulating film 1130 is formed to cover the conductive films 1226 to 1229, and conductive films 1131 are formed over the insulating film 1130 so as to be electrically connected to the source or drain regions of the first to fourth semiconductor films 1106 to 1109. Accordingly, a p-channel thin film transistor 1151a and n-channel thin film transistors 1151b to 1151d using the first to fourth semiconductor films 1106 to 1109 as channel forming regions are provided (FIG. 15B). It is to be noted that the thin film transistors 1151a to 1151d can employ any of the structures shown in the above embodiment modes without being limited to the structure of FIG. 15B.

Then, an insulating film 1132 is formed so as to cover the conductive films 1131, conductive films 1133 each serving as an antenna are formed over the insulating film 1132, and an insulating film 1134 is formed so as to cover the conductive films 1133 (FIG. 15C). It is to be noted that the thin film transistors 1151a to 1151d, the conductive films 1133 provided over the thin film transistors 1151a to 1151d, and the like are referred to as an element group 1155 for convenience sake here.

The insulating films 1130, 1132, and 1134 can be formed by using a single layer structure of an organic material such as epoxy, polyimide, polyamide, polyvinyl phenol, benzocyclobutene, or acrylic, a siloxane based material, or the like in addition to an insulating film containing oxygen or nitrogen such as a silicon oxide ($SiO_x$) film, a silicon nitride ($SiN_x$) film, a silicon oxynitride ($SiO_xN_y$) film (x>y), or a silicon nitride oxide ($SiN_xO_y$) film (x>y), or a film containing carbon such as a DLC (diamond like carbon) film, or a stacked structure thereof In particular, an organic material such as epoxy, polyimide, polyamide, polyvinyl phenol, benzocyclobutene, or acrylic, a siloxane based material, or the like can be formed by a spin coating method, a droplet discharging method, a printing method, or the like. Thus, planarization or efficiency of processing time can be realized. The same material or different materials may be used to form the insulating films 1130, 1132 and 1134. In addition, it is also possible to oxide or nitride the insulating films 1130, 1132, and 1134 by performing plasma treatment.

As the conductive film 1133, a conductive material containing one or more of metal such as copper (Cu), aluminum (Al), silver (Ag), gold (Au), chromium (Cr), molybdenum (Mo), titanium (Ti), tantalum (Ta), tungsten (W), nickel (Ni), and carbon (C), or metal compounds can be used.

Next, openings 1150 are formed in regions where the thin film transistors 1151a to 1151d are not formed to expose the peeling layer 1103, and the peeling layer 1103 is removed by introducing an etching agent from the openings 1150 (FIG. 16A). The peeling layer 1103 may be completely removed or selectively removed to leave part thereof. By leaving part of the peeling layer 1103, even after the peeling layer 1103 is removed by the etching agent, the thin film transistors 1151a to 1151d can be held over the substrate 1101, and handling in a subsequent step becomes simple and easy. As the etching agent, a gas or liquid containing halogen fluoride or halogen, such as a chlorine trifluoride gas, can be used. In addition, $CF_4$, $SF_6$, $NF_3$, $F_2$, or the like can be used.

Then, a first sheet material 1152 having an adhesion property is attached to the insulating film 1134, and the element group 1155 is peeled form the substrate 1101 (FIG. 16B).

As the first sheet material 1152, a flexible film can be used, and at least one surface thereof has an adhesive. For example, a sheet material, in which an adhesive is provided on a base film used as a base material such as polyester, can be used. As the adhesive, a material made of a rein material containing an acrylic resin or the like, or a synthetic rubber material can be used.

The peeled element group 1155 is sealed with a flexible film. Here, the element group 1155 is sealed with a second sheet material 1153 and a third sheet material 1154 (FIG. 16C).

Flexible films can be used for the second sheet material 1153 and the third sheet material 1154. For example, a film made of polypropylene, polyester, vinyl, polyvinyl fluoride, vinyl chloride, or the like; paper made of a fibrous material; a stacked film of a base film (polyester, polyamide, an inorganic evaporated film, paper, or the like) and an adhesive synthetic resin film (an acrylic based synthetic resin, an epoxy based synthetic resin, or the like); or the like can be used. In addition, the film is attached to an object by heat treatment and pressure treatment, and when heat treatment and pressure treatment are performed, an adhesive layer provided on the top surface of the film or a layer provided in the outermost layer (not an adhesive layer) is melted by the heat treatment and bonded by the pressure treatment. In addition, when the element group is sealed with the first sheet material 1152 and the second sheet material 1153, the same material may be used for the first sheet material for the sealing.

Through the above steps, a semiconductor device which has a memory element and can transmit and receive data without contact can be obtained. In addition, the semiconductor device shown in this embodiment mode is flexible.

Subsequently, an application example of a semiconductor device capable of transmitting and receiving data without contact will be described with reference to the drawings. The semiconductor device capable of transmitting and receiving data without contact is referred to as an RFID (Radio Frequency Identification) tag, an ID tag, an IC tag, an IC chip, an RF (Radio Frequency) tag, a wireless tag, an electronic tag, or a wireless chip, depending on an application mode.

Figure 17A:
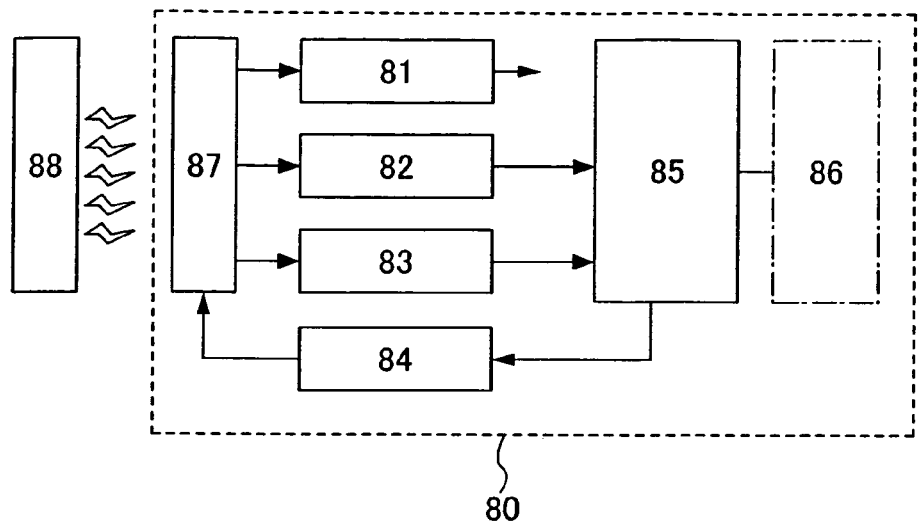
FIG. 17A is a block diagram explaining an RFID tag according to Embodiment Mode 7.

An RFID tag 80 has a function of transmitting and receiving data without contact, and includes a power supply circuit 81, a clock generation circuit 82, a data demodulation circuit 83, a data modulation circuit 84, a control circuit 85 for controlling other circuits, a memory circuit 86, and an antenna 87 (FIG. 17A). Further, the RFID tag may include plural memory circuits, being not limited to one memory circuit, and an SRAM, a flash memory, a ROM, a FeRAM, a circuit using an organic compound layer in a memory element portion, and the like can be used.

Signals sent from a reader/writer 88 as radiowaves are modulated into alternating-current electric signals in the antenna 87 by electromagnetic induction. A power supply voltage is generated in the power supply circuit 81 by using the alternating-current electric signals, and supplied to each circuit using a power supply wiring. The clock generation circuit 82 generates various kinds of clock signals based on the alternating-current electric signals, which are inputted from the antenna 87, and supplies the various kinds of clock signals to the control circuit 85. The modulation circuit 83 demodulates the alternating-current electric signals and supplies the demodulated alternating-current electric signals to the control circuit 85. In the control circuit 85, various kinds of arithmetic processings are performed in accordance with the inputted signals. Programs, data and the like that are used in the control circuit 85 are stored in the memory circuit 86. In addition, the memory circuit 86 can also be used as a work area in the arithmetic processings. Then, data is sent to the modulation circuit 84 from the control circuit 85, and load modulation can be applied to the antenna 87 from the modulation circuit 84 in accordance with the data. Consequently, the reader/writer 88 receives load modulation applied to the antenna 87 via radiowaves so that the reader/writer 88 can read the data.

Furthermore, the RFID tag may be of a type in which a power supply voltage is supplied to each circuit via radiowaves without having a power source (a battery), or a type in which a power source (a battery) is provided and a power supply voltage is supplied to each circuit by utilizing both radiowaves and the power source (the battery).

An RFID tag which can be bent can be manufactured by employing such a structure described in the above embodiment modes, and such an RFID tag can be attached to an article having a curved surface.

Figure 17B:
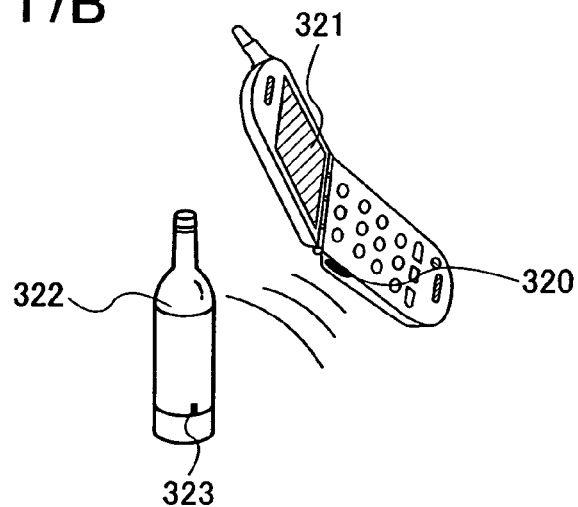
FIGS. 17B and 17C are perspective views each showing an example of a usage pattern of an RFID tag.
Figure 17C:
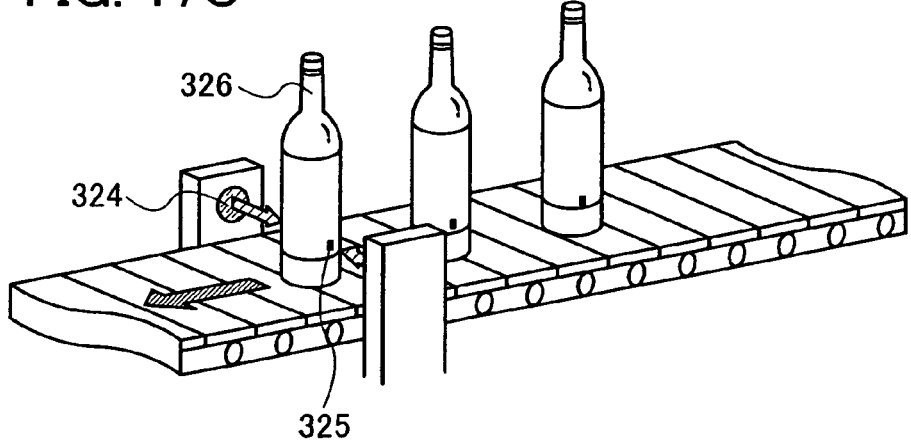
Figure 18A:
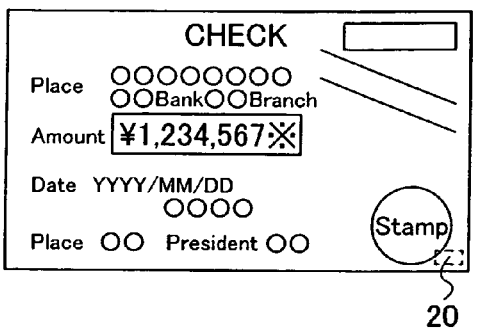
FIGS. 18A to 18H are perspective views each showing an example of a usage pattern of an RFID tag according to Embodiment Mode 7.
Figure 18B:
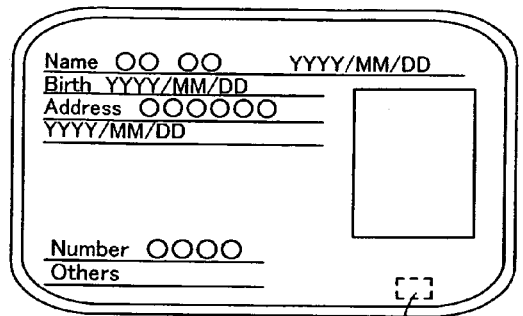
Figure 18C:
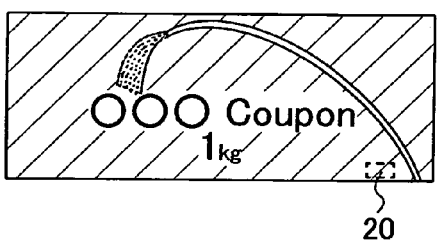
Figure 18D:
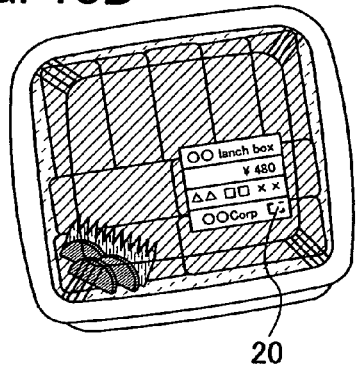
Figure 18E:
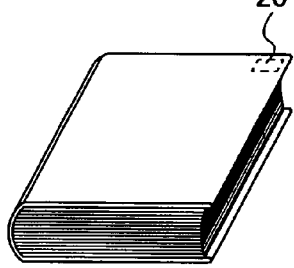
Figure 18F:
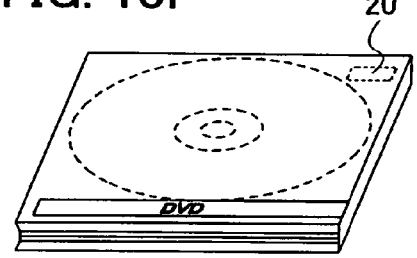
Figure 18G:
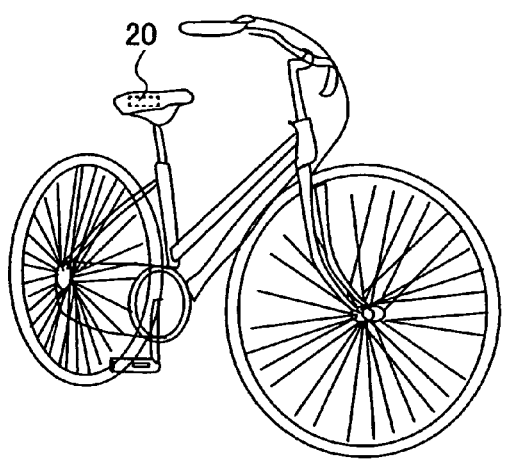
Figure 18H:
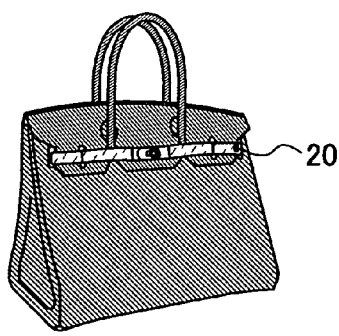

Next, an example of a usage pattern of a flexible RFID tag will be described. A reader/writer 320 is provided on a side surface of a portable terminal that includes a display portion 321. An RFID tag 323 is provided on a side surface of a product 322 (FIG. 17B). When holding the reader/writer 320 over the RFID tag 323 included in the product 322, information about the product such as a raw material, a place of origin, test results in each production process, history of distribution process, and a description of the product, is displayed on the display portion 321. In addition, when conveying a product 326 by a belt conveyor, the inspection of the product 326 can be carried out by using a reader/writer 324 and an RFID tag 325 provided on the product 326 (FIG. 17C). In this way, by utilizing an RFID tag for a system, information can be easily obtained, thereby realizing high performance and a high added value. As described in the above embodiment modes, even when an RFID tag is attached to an article having a curved surface, damages to a thin film transistor or the like included in the RFID tag can be prevented, and a highly reliable RFID tag can be provided.

A flexible RFID tag can be widely used in addition to the above and applied to any products as far as the RFID tag can clarify information such as a history of an object without contact and be used for production, management, and the like of the object. For example, an RFID tag can be provided to bills, coins, securities, certificates, bearer bonds, packing containers, documents, recording media, personal belongings, vehicles, foods, clothes, health goods, livingwares, chemicals, electronic devices, and the like. Examples thereof will be described with reference to FIGS. 18A to 18H.

Bills and coins indicate money circulated in the market, and include a thing valid in a certain area as currency (cash vouchers), memorial coins, and the like. Securities indicate checks, certificates, promissory notes, and the like (see FIG. 18A). Certificates indicate driver's licenses, certificates of residence, and the like (see FIG. 18B). Bearer bonds indicate stamps, rice coupons, various merchandise coupons, and the like (see FIG. 18C). Packing containers indicate wrapping papers for lunch boxes and the like, plastic bottles, and the like (see FIG. 18D). Documents indicate volumes, books, and the like (see FIG. 18E). Recording media indicate DVD software, video tapes, and the like (see FIG. 18F). Vehicles indicate vehicles such as bicycles, ships, and the like (see FIG. 18G). Personal belongings indicate bags, glasses, and the like (see FIG. 18H). Foods indicate food goods, drinks, and the like. Clothing indicates clothes, footwear, and the like. Health goods indicate medical appliances, health appliances, and the like. Livingwares indicate furniture, lighting equipment, and the like. Chemicals indicate medical products, agrochemicals, and the like. Electronic devices indicate liquid crystal display devices, EL display devices, television devices (television sets or flat-screen television sets), cellular phones, and the like.

By providing RFID tags to bills, coins, securities, certificates, bears bonds, and the like, counterfeits can be prevented. Further, efficiency of an inspection system or a system used in a rental shop can be improved by providing RFID tags to packing containers, documents, recording media, personal belongings, foods, livingwares, electronic devices, and the like. By providing RFID tags to vehicles, health goods, chemicals, and the like, counterfeits and theft can be prevented. In the case of a medicine, it is possible to prevent it from being taken by mistake. An RFID tag is provided to the foregoing items by sticking it to their surfaces or embedding it therein. For example, an RFID tag may be embedded in paper in the case of a book, or embedded in an organic resin in a case of a packaging made from the organic resin. By using a flexible RFID tag, even when the RFID tag is provided in paper or the like, an element included in the RFID tag can be prevented from being broken by constituting the RFID tag with a semiconductor device having a structure shown in the above embodiment modes.

Further, by embedding the RFID tags in creatures such as animals, individual creatures can be easily identified. For example, by embedding an RFID tag provided with a sensor in a creature such as livestock, a birth year, sexuality, breed, and the like as well as a health condition such as a body temperature can be easily checked.

Embodiment Mode 8

A light emitting device according to Embodiment Mode 8 of the present invention will be described with reference to the drawings. First, steps of forming components up to a TFT shown in FIGS. 19A to 19D are carried out. A gate insulating film 5 of the TFT is the same as any of those in Embodiment Modes 1 to 3. The TFT includes a gate electrode 8a, the gate insulating film 5, and a polysilicon film 3, and is formed over a glass substrate 1 having a base insulating film 2. It is to be noted that FIGS. 19A to 19D show only one of TFTs.

Figure 19A:
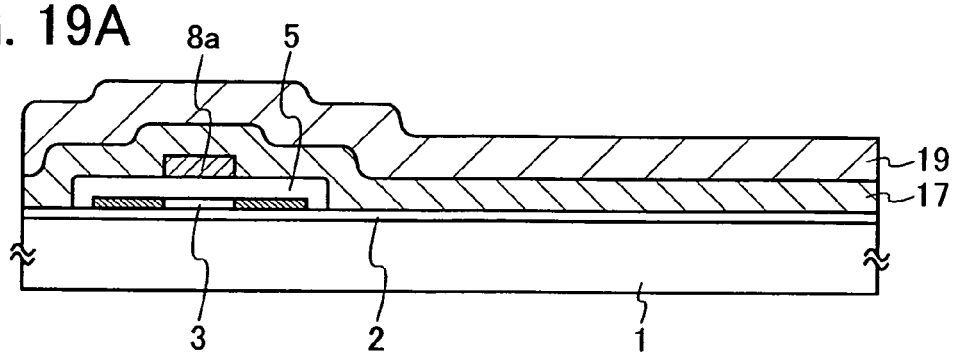
FIGS. 19A to 19D are cross-sectional views each explaining a manufacturing method of a light emitting device according to Embodiment Mode 8.
Figure 19B:
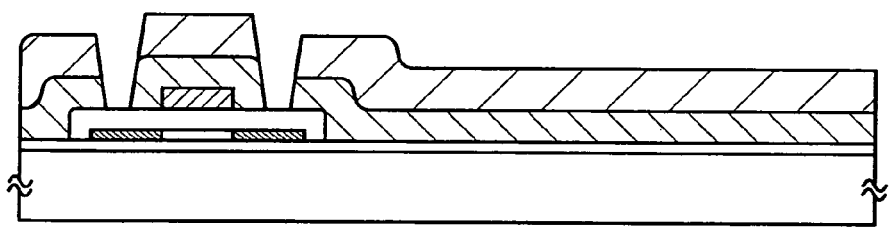

After forming an interlayer insulating film 17, a planarizing film to be a second interlayer insulating film 19 is formed (FIG. 19A). Then, contact holes are formed in the second interlayer insulating film 19 and the interlayer insulating film 17 by using a resist mask. Next, contact holes each reaching a semiconductor layer are formed by etching the gate insulating film 5. The contact holes can be formed by performing etching with the use of a resist mask until the semiconductor layer is exposed. Either wet etching or dry etching can be carried out. The etching may be performed once or plural times depending on the condition. When the etching is performed plural times, both wet etching and dry etching may be performed (FIG. 19B).

Figure 19C:
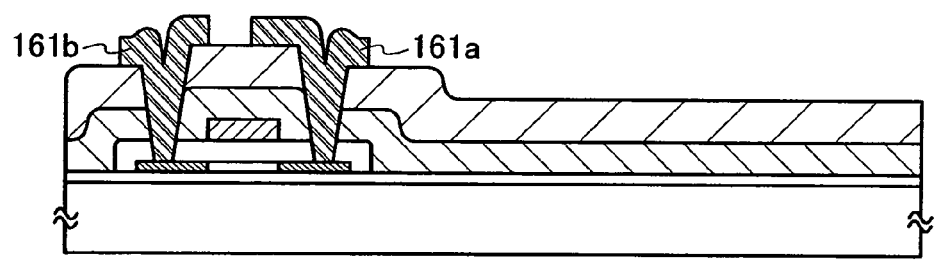

Then, a conductive layer is formed so as to cover the contact holes and the second interlayer insulating film 19. A connecting portion 161a, a wiring 161b, and the like are formed by processing the conductive layer into a desired shape. This wiring may be a single layer of aluminum; copper; alloy of aluminum, carbon, and nickel; alloy of aluminum, carbon, and molybdenum; or the like. Alternatively, the wiring may be formed into a stacked structure of molybdenum, aluminum, and molybdenum in the order from the substrate. Furthermore, a stacked structure of titanium, aluminum, and titanium, or titanium, titanium nitride, aluminum, and titanium can also be used (FIG. 19C).

Figure 19D:
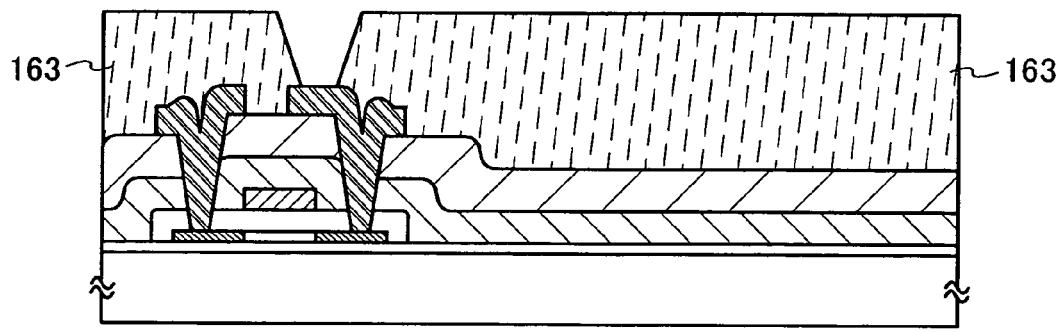

Thereafter, a third interlayer insulating film 163 is formed to cover the connecting portion 161a, the wiring 161b, and the second interlayer insulating film 19. As a material of the third interlayer insulating film 163, a self-planarizing coating film of acrylic, polyimide, siloxane, or the like is preferably used. In this embodiment mode, the third interlayer insulating film 163 is formed of siloxane (FIG. 19D).

An insulating layer may be formed of silicon nitride over the third interlayer insulating film 163. This insulating layer is formed to prevent the third interlayer insulating film 163 from being etched more than necessary in a later step of etching a pixel electrode. Therefore, the insulating layer is not necessary when a difference is large between the etching rates of the pixel electrode and the third interlayer insulating film.

Then, a contact hole penetrating the third interlayer insulating film 163 to reach the connecting portion 161a is formed. After a light-transmitting conductive layer is formed so as to cover the contact hole and the third interlayer insulating film 163 (or the insulating layer), the light-transmitting conductive layer is processed to form a first electrode 164 of a thin film light emitting element. Here, the first electrode 164 electrically contacts the connecting portion 161a.

The first electrode 164 can be formed of a material such as conductive metal, e.g. aluminum (Al), silver (Ag), gold (Au), platinum (Pt), nickel (Ni), tungsten (W), chromium (Cr), molybdenum (Mo), iron (Fe), cobalt (Co), copper (Cu), palladium (Pd), lithium (Li), cesium (Cs), magnesium (Mg), calcium (Ca), strontium (Sr), titanium (Ti), or the like; alloy thereof such as aluminum-silicon (Al—Si), aluminum-titanium (Al—Ti), or aluminum-silicon-copper (Al—Si—Cu); nitride of the metal material such as titanium nitride (TiN); a metal compound such as ITO (indium tin oxide), ITO containing silicon, or indium zinc oxide (IZO) in which 2 to 20 atomic % of zinc oxide (ZnO) is mixed in indium oxide; or the like.

Figure 20A:
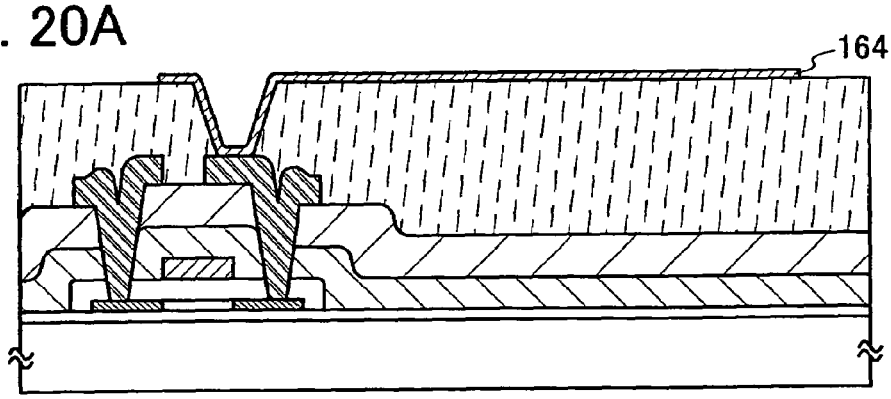
FIGS. 20A to 20C are cross-sectional views each explaining a manufacturing method of a light emitting device according to Embodiment Mode 8.

An electrode through which light is emitted may be formed of a transparent conductive film. For example, a metal compound such as ITO (indium tin oxide), indium tin oxide containing silicon oxide (ITSO), or IZO (indium zinc oxide) in which 2 to 20 atomic % of zinc oxide (ZnO) is mixed in indium oxide can be used. Alternatively, an extremely thin film of metal such as Al or Ag is used. When light is emitted through a second electrode, a highly-reflective material (such as Al or Ag) can be used for the first electrode 164. In this embodiment mode, ITSO is used for the first electrode 164 (FIG. 20A).

Figure 20B:
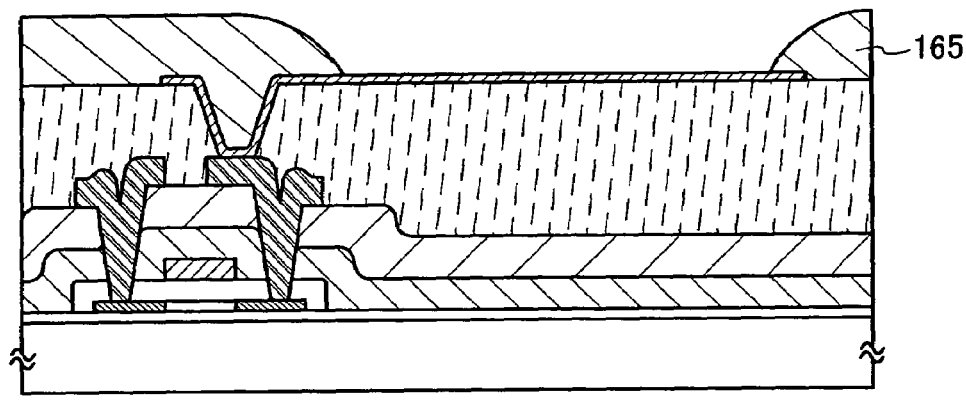

Next, an insulating layer formed of an organic material or an inorganic material is formed so as to cover the third interlayer insulating film 163 (or the insulating layer) and the first electrode 164. Subsequently, the insulating layer is processed so as to partially expose the first electrode 164, thereby forming a partition wall 165. As a material of the partition wall 165, a photosensitive organic material (such as acrylic or polyimide) is preferable. However, a non-photosensitive-organic or inorganic material may also be used. Further, the partition wall 165 may be used as a black matrix by making the partition wall 165 black in such a way that a black pigment or dye such as titanium black or carbon nitride is diffused into the material of the partition wall 165 using a dispersant or the like. It is desirable that the partition wall 165 have a tapered shape where its end surface toward the first electrode has curvature changing continuously (FIG. 20B).

Figure 20C:
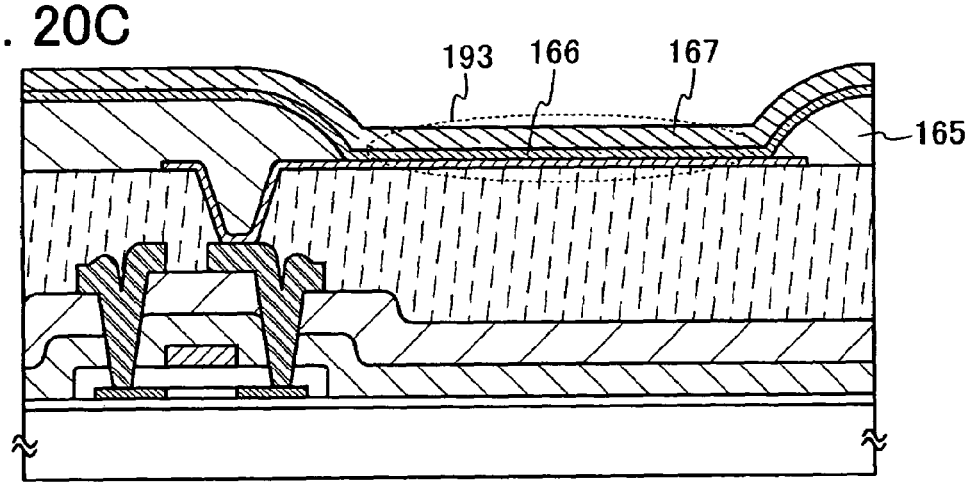

Then, a layer 166 containing a light emitting substance is formed, and subsequently, a second electrode 167 covering the layer 166 containing a light emitting substance is formed. Thus, a light emitting element 193 in which the layer 166 containing a light emitting substance is interposed between the first electrode 164 and the second electrode 167 can be manufactured, and light emission can be obtained by applying a higher voltage to the first electrode than to the second electrode (FIG. 20C). For an electrode material used for forming the second electrode 167, the same material as that of the first electrode can be used. Aluminum is used for the second electrode in this embodiment mode.

Further, the layer 166 containing a light emitting substance is formed by an evaporation method, an ink-jet method, a spin coating method, a dip coating method, or the like. The layer 166 containing a light emitting substance may be a stacked layer of layers having various functions such as hole transport, hole injection, electron transport, electron injection, and light emission, or may be a single layer of a light emitting layer. As a material used for the layer containing a light emitting substance, a single layer or a stacked layer of an organic compound is used in many cases. In the present invention however, an inorganic compound may be used in part of a film formed of an organic compound, for the layer in contact with the first or the second electrode, for example.

Thereafter, as a passivation film, a silicon oxide film containing nitrogen is formed by a plasma CVD method. In a case of using the silicon oxide film containing nitrogen, a silicon oxynitride film formed of $SiH_4$, $N_2O$, and $NH_3$, a silicon oxynitride film formed of $SiH_4$ and $N_2O$, or a silicon oxynitride film formed of a gas in which $SiH_4$ and $N_2O$ are diluted with Ar may be formed by a plasma CVD method.

As the passivation film, a silicon oxynitride hydride film formed of $SiH_4$, $N_2O$, and $H_2$ may also be employed. Naturally, a first passivation film is not limited to a single-layer structure, and another insulating film containing silicon may also be used in a single-layer structure or a stacked structure. A multilayer film of a carbon nitride film and a silicon nitride film, a multilayer film of a styrene polymer, a silicon nitride film, or a diamond-like carbon film may also be formed instead of a silicon oxide film containing nitrogen.

Subsequently, in order to protect the light emitting element from a deterioration-promoting substance such as water, a display portion is sealed. In a case of using an opposing substrate for the sealing, the opposing substrate is attached with an insulating sealing material so as to expose an external connecting portion. The space between the opposing substrate and the element substrate may be filled with an inert gas such as dry nitrogen, or the entire surface of the pixel portion may be coated with the sealing material for attaching the opposing substrate. It is preferable to use an ultraviolet curable resin or the like for the sealing material. A drying agent or particles for keeping the gap between the substrates uniform may be mixed into the sealing material. Subsequently, a flexible wiring substrate is attached to the external connecting portion, thereby completing a light emitting device.

Examples of a structure of the thus manufactured light emitting device will be described with reference to FIGS. 21A and 21B. Although the shapes are different, parts having the same functions are denoted by the same reference numerals and the description thereof may be omitted. In this embodiment mode, a thin film transistor 170 is connected to the light emitting element 193 through the connecting portion 161*a*.

Figure 21A:
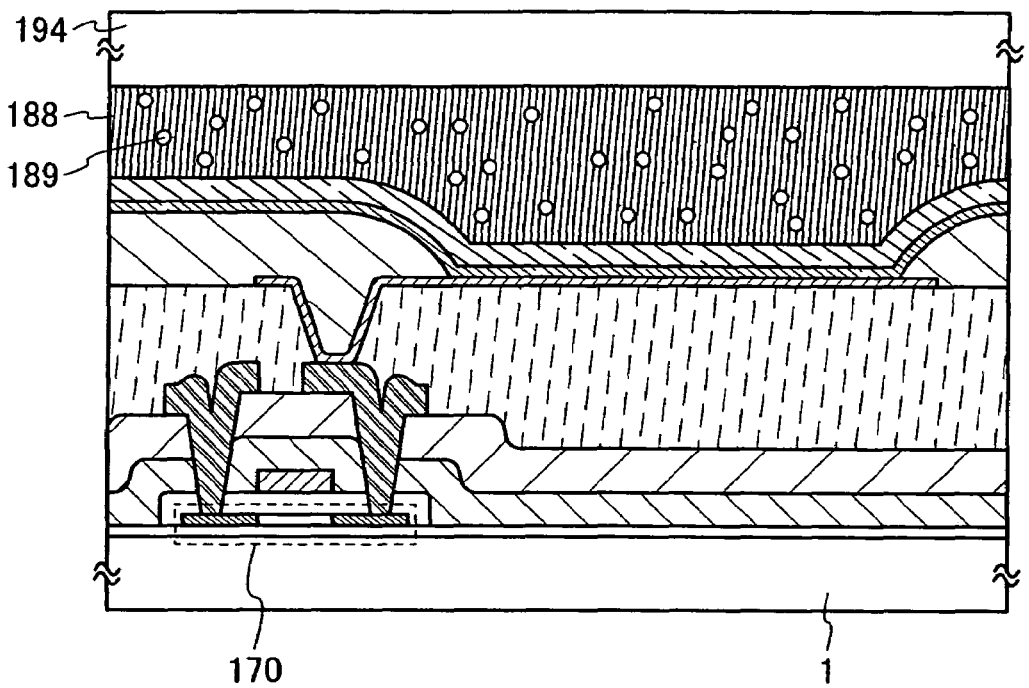
FIGS. 21A and 21B are cross-sectional views each showing a structural example of a light emitting device according to Embodiment Mode 8.

In FIG. 21A, the first electrode 164 is formed of a light-transmitting conductive film and light emitted from the layer 166 containing a light emitting substance is extracted from a substrate 1 side. Reference numeral 194 denotes an opposing substrate, which is fixed to the substrate 1 with a sealing material or the like after forming the light emitting element 193. By filling the space between the opposing substrate 194 and the element with a light-transmitting resin 188 or the like and sealing the element, it is possible to prevent the light emitting element 193 from deteriorating due to moisture. Further, the resin 188 desirably has hygroscopicity. In addition, it is more desirable that a drying agent 189 having a high light-transmitting property be dispersed in the resin 188 so that the influence of moisture can be further suppressed.

Figure 21B:
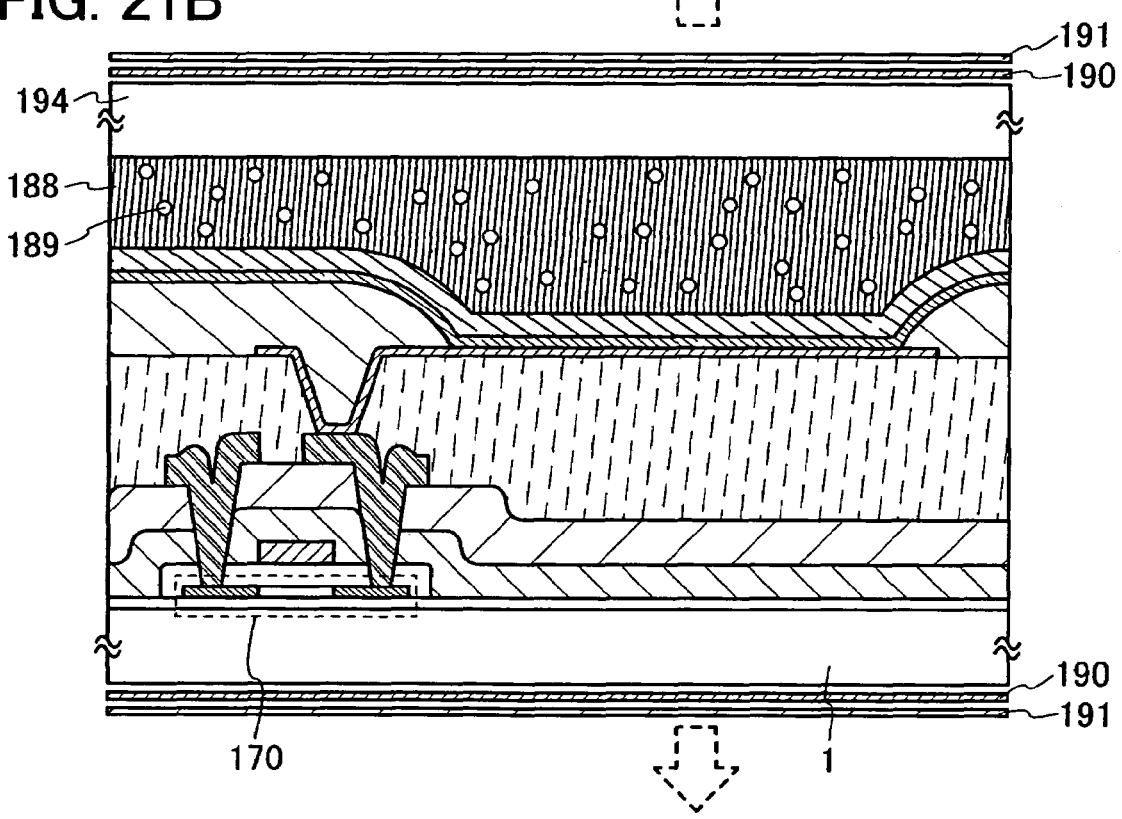

In FIG. 21B, each of the first electrode 164 and the second electrode 167 is formed of a light-transmitting conductive film, and light can be extracted from both the substrate 1 and the opposing substrate 194. In this structure, it is possible to prevent the screen from being translucent by providing polarizing plates 190 outside the substrate 1 and the opposing substrate 194, whereby the visibility is enhanced. Protective films 191 are preferably provided outside the polarizing plates 190.

Either an analog video signal or a digital video signal may be used in the light emitting device having a display function according to the present invention. The digital video signal includes a video signal using a voltage and a video signal using a current. When the light emitting element emits light, a video signal inputted into a pixel uses a constant voltage or a constant current. When a video signal uses a constant voltage, a voltage applied to the light emitting element or a current flowing into the light emitting element is constant. Meanwhile, when a video signal uses a constant current, a voltage applied to the light emitting element or a current flowing into the light emitting element is constant. The light emitting element to which a constant voltage is applied is driven by constant voltage driving, and the light emitting element into which a constant current flows is driven by constant current driving. A constant current flows in the constant current driving without being influenced by the change in resistance of the light emitting element. Any of the above driving methods may be used for a light emitting device according to this embodiment mode.

A light emitting device according to the present invention having such a structure is a highly reliable light emitting device. In the light emitting device according to the present invention having such a structure, blue light emission with favorable color purity can be obtained. Further, in the light emitting device according to the present invention having such a structure, favorable color reproducibility can be obtained. This embodiment mode can be combined with an appropriate structure of the above embodiment modes.

Embodiment Mode 9

Figure 22A:
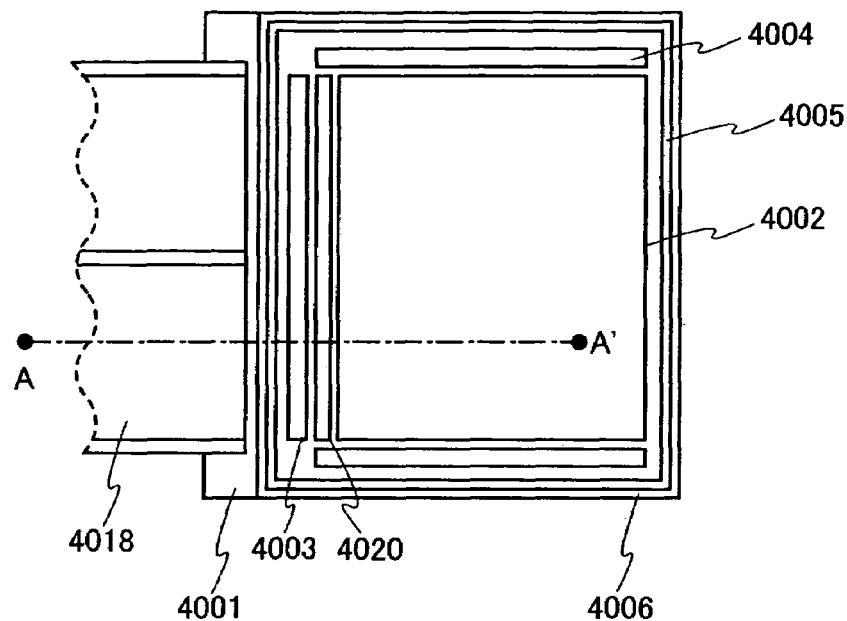
FIG. 22A is a plan view showing a light emitting device according to Embodiment Mode 9.
Figure 22B:
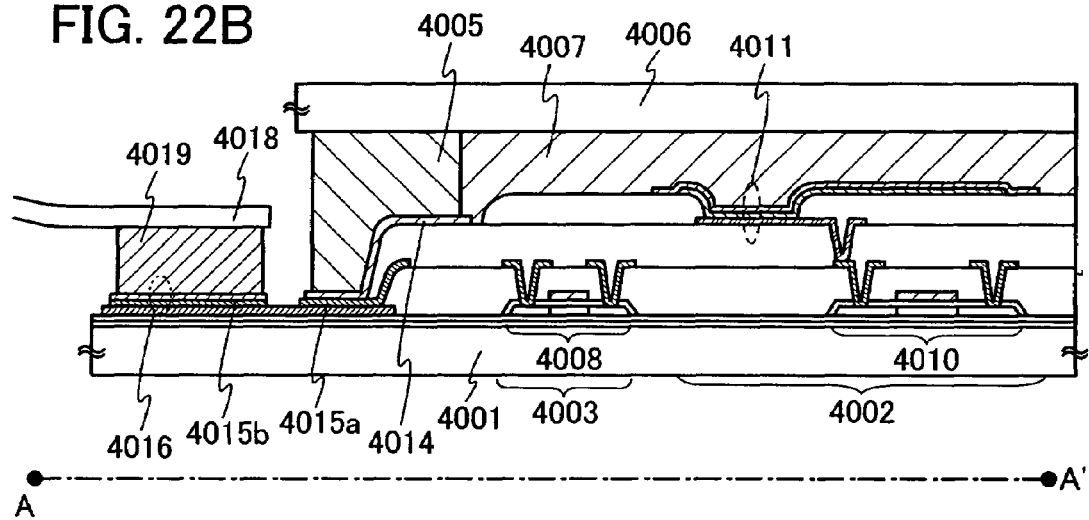
FIG. 22B is a cross-sectional view taken along a line A-A' of FIG. 22A.

This embodiment will describe an appearance of a panel which is a light emitting device of the present invention with reference to FIGS. 22A and 22B. FIG. 22A is a top view of a panel in which a transistor and a light emitting element formed over a substrate are sealed with a sealing material formed between the substrate and an opposing substrate 4006. FIG. 22B is a cross-sectional view of FIG. 22A. The light emitting element mounted on this panel has a structure as described in the above embodiment modes.

A sealing material 4005 is provided so as to surround a pixel portion 4002, a signal line driver circuit 4003, and a scanning line driver circuit 4004 which are provided over a substrate 4001. In addition, the opposing substrate 4006 is provided over the pixel portion 4002, the signal line driver circuit 4003, and the scanning line driver circuit 4004. Thus, the pixel portion 4002, the signal line driver circuit 4003, and the scanning line driver circuit 4004 together with filler 4007 are sealed with the substrate 4001, the sealing material 4005, and the opposing substrate 4006.

The pixel portion 4002, the signal line driver circuit 4003, and the scanning line driver circuit 4004 provided over the substrate 4001 each have a plurality of thin film transistors. FIG. 22B shows a thin film transistor 4008 included in the signal line driver circuit 4003 and a thin film transistor 4010 included in the pixel portion 4002. A light emitting element 4011 is electrically connected to the thin film transistor 4010.

Further, a lead wiring 4014 corresponds to a wiring for supplying a signal or a power supply voltage to the pixel portion 4002, the signal line driver circuit 4003, and the scanning line driver circuit 4004. The lead wiring 4014 is connected to a connecting terminal 4016 through a lead wiring 4015. The connecting terminal 4016 is electrically connected to a terminal of an FPC (flexible printed circuit) 4018 through an anisotropic conductive film 4019.

As the filler 4007, in addition to an inert gas such as nitrogen or argon, an ultraviolet curable resin or a thermosetting resin can be used. For example, polyvinyl chloride, acrylic, polyimide, an epoxy resin, a silicon resin, polyvinyl butyral, or ethylene vinylene acetate can be used.

It is to be noted that the light emitting device according to the present invention includes, in its category, a panel in which the pixel portion having the light emitting element is formed and a module in which an IC is mounted on the panel. This embodiment mode can be combined with an appropriate structure of the above embodiment modes.

Embodiment Mode 10

This embodiment mode will describe a pixel circuit and a protective circuit in the panel and the module shown in Embodiment Modes 8 and 9, and their operation. It is to be noted that the cross-sectional views shown in FIGS. 19A to 19D, 20A to 20C, 21A and 21B, and 22B each correspond to a cross-sectional view of a driving TFT 1403 or a switching TFT 1401, and a light emitting element 1405.

Figure 23A:
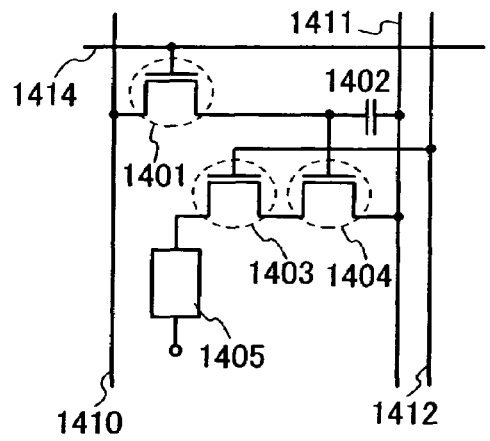
FIGS. 23A to 23F are circuit diagrams each showing a pixel circuit of a light emitting device according to Embodiment Mode 10.

A pixel shown in FIG. 23A includes a signal line 1410 and power supply lines 1411 and 1412 in a column and a scanning line 1414 in a row. The pixel further includes a switching TFT

1401, a driving TFT 1403, a current control TFT 1404, a capacitor element 1402, and a light emitting element 1405.

Figure 23B:
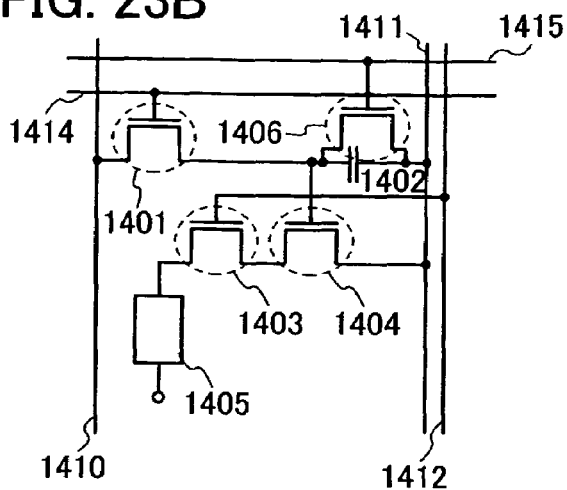
Figure 23C:
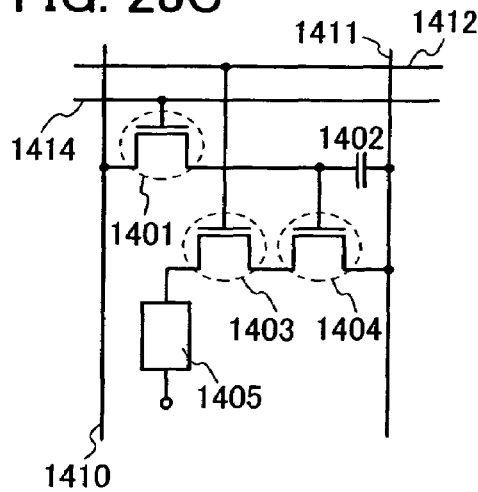
Figure 23D:
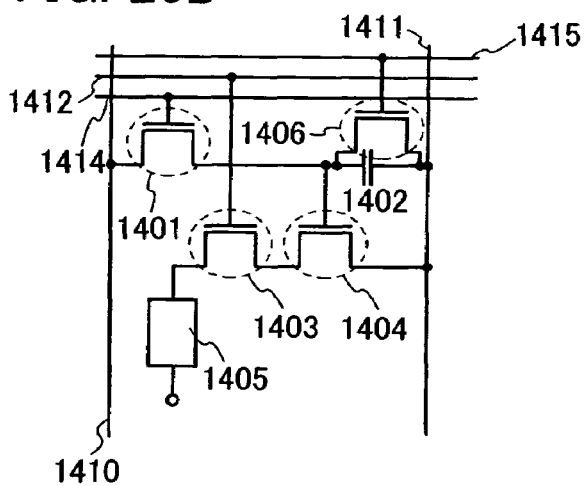

A pixel shown in FIG. 23C has the same structure as that in FIG. 23A except for that a gate electrode of the driving TFT 1403 is connected to the power supply line 1412 arranged in a row. In other words, the pixels shown in FIGS. 23A and 23C have the same equivalent circuit diagram. However, in the case of arranging the power supply line 1412 in a column (FIG. 23A) and in the case of arranging the power supply line 1412 in a row (FIG. 23C), each power supply line is formed using a conductive film in a different layer. Here, attention is paid to a wiring connected to the gate electrode of the driving TFT 1403, and the structures are shown separately in FIGS. 23A and 23C in order to show that these wirings are manufactured in different layers.

As a feature of the pixels shown in FIGS. 23A and 23C, the driving TFT 1403 and the current control TFT 1404 are connected in series within the pixel, and it is preferable to set the channel length L (1403) and the channel width W (1403) of the driving TFT 1403, and the channel length L (1404) and the channel width W (1404) of the current control TFT 1404 so as to satisfy L (1403)/W (1403):L (1404)/W (1404)=5 to 6000: 1.

The driving TFT 1403 operates in a saturation region and serves to control the value of a current flowing into the light emitting element 1405. The current control TFT 1404 operates in a linear region and serves to control current supply to the light emitting element 1405. Both TFTs preferably have the same conductivity type considering the manufacturing process, and are n-channel TFTs in this embodiment mode. The driving TFT 1403 may be either an enhancement mode TFT or a depletion mode TFT. Since the current control TFT 1404 operates in a linear region in the light emitting device according to the present invention having the above structure, a slight change in Vgs of the current control TFT 1404 does not affect the current value of the light emitting element 1405. In other words, the current value of the light emitting element 1405 can be determined by the driving TFT 1403 operating in a saturation region. With the above structure, variation in luminance of the light emitting element due to variation in characteristics of the TFT can be reduced, thereby providing a light emitting device in which image quality is improved.

In the pixels shown in FIGS. 23A to 23D, the switching TFT 1401 controls input of a video signal to the pixel, and a video signal is inputted into the pixel when the switching TFT 1401 is turned on. Then, a voltage of the video signal is held in the capacitor element 1402. Although FIGS. 23A and 23C each show the structure in which the capacitor element 1402 is provided, the present invention is not limited thereto. When the gate capacitance or the like can serve as a capacitor holding the video signal, the capacitor element 1402 is not necessarily provided.

A pixel shown in FIG. 23B has the same pixel structure as that in FIG. 23A except for that a TFT 1406 and a scanning line 1415 are additionally provided. Similarly, a pixel shown in FIG. 23D has the same pixel structure as that in FIG. 23C expect for that the TFT 1406 and the scanning line 1415 are additionally provided.

ON and OFF of the TFT 1406 is controlled by the additionally provided scanning line 1415. When the TFT 1406 is turned on, the charge held in the capacitor element 1402 is discharged; thus, the current control TFT 1404 is turned off. In other words, by the provision of the TFT 1406, a state can be produced forcedly, in which a current does not flow into the light emitting element 1405. For this reason, the TFT 1406 can be referred to as an erasing TFT. Consequently, in the structures shown in FIGS. 23B and 23D, a lighting period can be started at the same time as or just after the start of a writing period before the writing of the signal into all the pixels; therefore, the duty ratio can be improved.

Figure 23E:
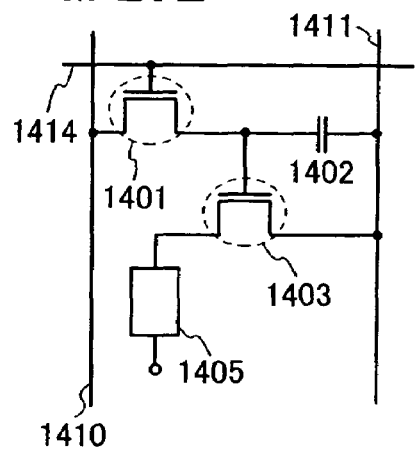
Figure 23F:
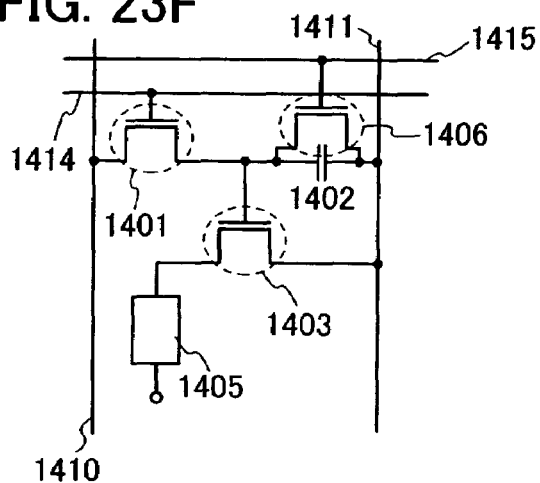

A pixel shown in FIG. 23E includes the signal line 1410 and the power supply line 1411 in a column, and the scanning line 1414 in a row. Further, the pixel includes the switching TFT 1401, the driving TFT 1403, the capacitor element 1402, and the light emitting element 1405. A pixel shown in FIG. 23F has the same pixel structure as that in FIG. 23E except for that the TFT 1406 and the scanning line 1415 are additionally provided. Also in the structure shown in FIG. 23F, the duty ratio can be improved by the provision of the TFT 1406.

As thus described, various kinds of pixel circuits can be employed. In particular, in a case of forming a thin film transistor using an amorphous semiconductor film, a semiconductor film of the driving TFT 1403 is preferably large. Therefore, in the above pixel circuit, a top emission type is preferable, in which light from the light emitting stack is emitted from the sealing substrate side. Such an active matrix light emitting device can be driven at a low voltage when pixel density increases, because the TFT is provided in each pixel, which is considered to be advantageous.

Although this embodiment mode describes the active matrix light emitting device in which a TFT is provided in each pixel, a passive matrix light emitting device can also be formed. Since a TFT is not provided in each pixel in the passive matrix light emitting device, high aperture ratio can be obtained. In a case of a light emitting device in which light is emitted from both sides of the light emitting stack, the transmittance is increased when the passive matrix light emitting device is used.

Subsequently, a case where the equivalent circuit shown in FIG. 23E is used and diodes are provided as protective circuits on the scanning line and the signal line will be described.

Figure 24:
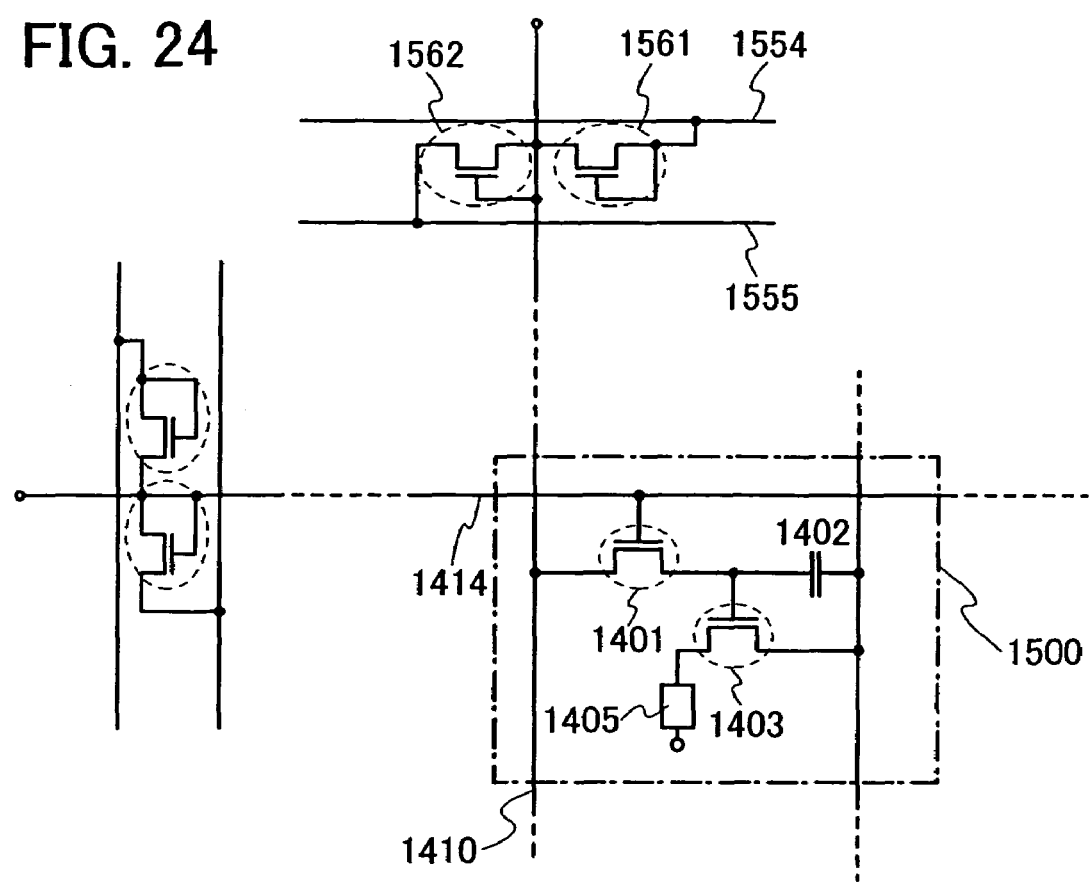
FIG. 24 is a circuit diagram showing a protective circuit of a light emitting device according to Embodiment Mode 10.

In FIG. 24, switching TFTs 1401 and 1403, a capacitor element 1402, and a light emitting element 1405 are provided in a pixel portion 1500. Diodes 1561 and 1562 are provided on a signal line 1410. Similarly to the switching TFTs 1401 and 1403, the diodes 1561 and 1562 are each manufactured based on the above embodiments, and have a gate electrode, a semiconductor layer, a source electrode, a drain electrode, and the like. The diodes 1561 and 1562 are operated as diodes by connecting the gate electrode with the drain electrode or the source electrode.

Common potential lines 1554 and 1555 connected to the diodes are formed using the same layer as the gate electrode. Therefore, in order to connect the common potential lines 1554 and 1555 with the source electrode or the drain electrode of the diodes, it is necessary to form a contact hole in a gate insulating layer. Diodes provided on a scanning line 1414 have the similar structure.

As thus described, according to the present invention, protective diodes provided in an input stage can be manufactured concurrently. The position where the protective diode is formed is not limited thereto, and the diode may also be provided between the driver circuit and the pixel. This embodiment mode can be combined with an appropriate structure of the above embodiment modes.

Embodiment Mode 11

A light emitting device according to Embodiment Mode 11 of the present invention will be described with reference to FIG. 25. This light emitting device has a mode in which a sealing material 746 partially overlaps with a driver circuit portion.

Figure 25:
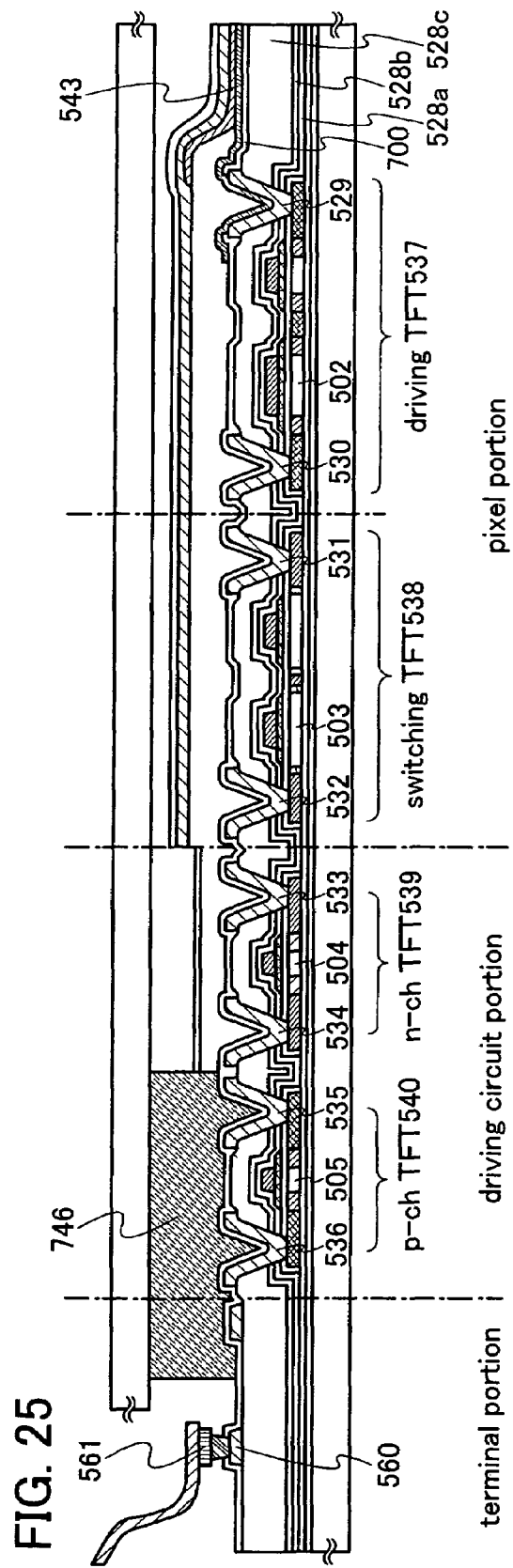
FIG. 25 is a cross-sectional view showing a light emitting device according to Embodiment Mode 11.

In FIG. 25, electrodes 529 to 536 serving as source electrodes or drain electrodes, which are electrically connected to semiconductor layers 502 to 505 through interlayer insulating films 528a to 528c; and an electrode 560 to be a terminal electrode are formed.

Next, a second interlayer insulating film 700 is formed over the interlayer insulating film 528c and the electrodes 529 to 536, and 560. For the second interlayer insulating film 700, an inorganic insulating film such as a silicon oxide film, a silicon nitride film, or a silicon oxynitride film can be used, and a single layer or a plurality of (two or more) layers of the insulating films may be formed. Further, as a method for forming such an inorganic insulating film, a sputtering method, an LPCVD method, a plasma CVD method, or the like may be used.

In this embodiment mode, the second interlayer insulating film 700 is formed of an inorganic insulating film with a thickness of 100 to 150 nm by a plasma CVD method. It is to be noted that the second interlayer insulating film 700 may be formed to have a thickness in a range of 50 to 500 nm (preferably, 100 to 300 nm).

Next, a resist mask is formed over the second interlayer insulating film 700, and etching is carried out selectively to form contact holes reaching the drain electrode 529 of the driving TFT and the electrode 560. Then, the resist mask is removed.

Next, a first electrode 543 and an electrode 561 to be a terminal electrode are formed. In this embodiment mode, the sealing material 746 is provided so as to partially overlap with the driver circuit portion. A region surrounded by the sealing material 746 may be filled with filler, or may be filled with a dry inert gas. It is to be noted that the sealing material 746 may be provided so as to surround the periphery of a display region, or may be provided only at the terminal portion.

When the second interlayer insulating film 700 is formed as in this embodiment mode, TFTs, wirings, or the like in the driver circuit portion can be prevented from being exposed and can be protected.

Embodiment Mode 12

Electronic devices according to Embodiment Mode 12 of the present invention will be described with reference to FIGS. 26A to 26E and 27. The electronic devices are each provided with a TFT, one example of which is described in the above embodiment modes.

The electronic devices include a camera such as a video camera or a digital camera; a goggle type display (a head-mounted display); a navigation system; an audio reproducing device (such as a car audio component); a computer; a game machine; a portable information terminal (such as a mobile computer, a cellular phone, a portable game machine, or an electronic book); an image reproducing device equipped with a recording medium (specifically, a device which can reproduce a content of a recording medium such as a digital versatile disc (DVD) and has a display for displaying an image thereof); and the like. Specific examples of these electronic devices are shown in FIGS. 26A to 26E, and 27.

Figure 26A:
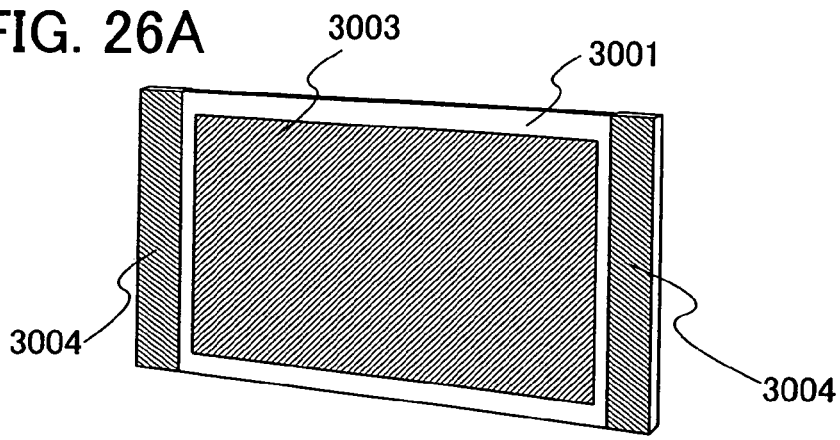
FIGS. 26A to 26E are perspective views each showing an example of an electronic device according to Embodiment Mode 12.

FIG. 26A is a monitor for a television set or a personal computer, which includes a housing 3001, a display portion 3003, speaker portions 3004, and the like. An active matrix display device is provided in the display portion 3003. Each pixel of the display portion 3003 includes a TFT manufactured by the manufacturing method of the present invention. By using such a TFT, a television with less characteristic deterioration can be obtained.

Figure 26B:
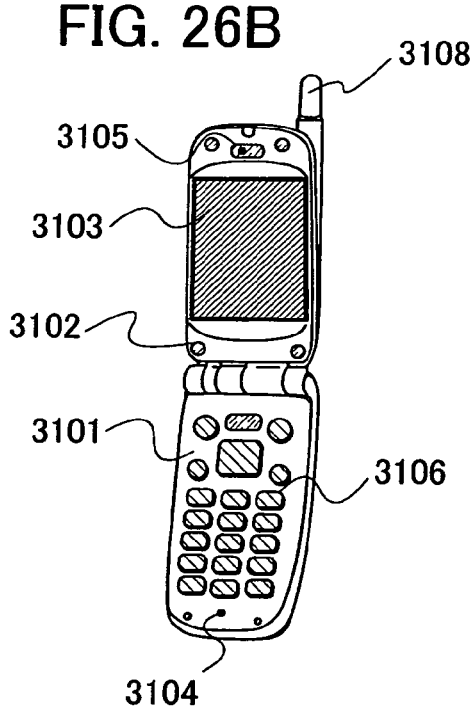

FIG. 26B is a cellular phone, which includes a main body 3101, a housing 3102, a display portion 3103, an audio input portion 3104, an audio output portion 3105, operation keys 3106, an antenna 3108, and the like. An active matrix display device is provided in the display portion 3103. Each pixel of the display portion 3103 includes a TFT manufactured by the manufacturing method of the present invention. By using such a TFT, a cellular phone with less characteristic deterioration can be obtained.

Figure 26C:
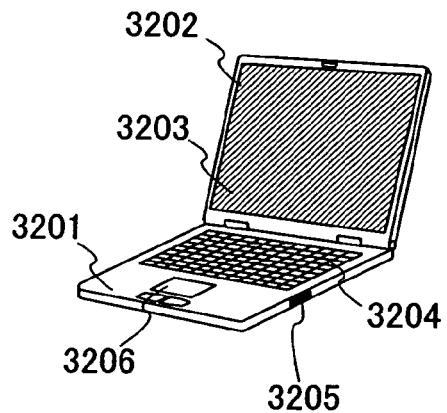

FIG. 26C is a computer, which includes a main body 3201, a housing 3202, a display portion 3203, a keyboard 3204, an external connecting port 3205, a pointing mouse 3206, and the like. An active matrix display device is provided in the display portion 3203. Each pixel of the display portion 3203 includes a TFT manufactured by the manufacturing method of the present invention. By using such a TFT, a computer with less characteristic deterioration can be obtained.

Figure 26D:
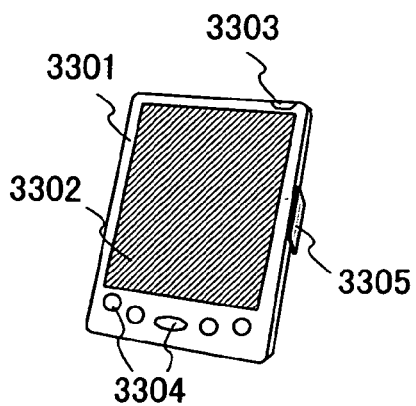

FIG. 26D is a mobile computer, which includes a main body 3301, a display portion 3302, a switch 3303, operation keys 3304, an infrared port 3305, and the like. An active matrix display device is provided in the display portion 3302. Each pixel of the display portion 3302 includes a TFT manufactured by the manufacturing method of the present invention. By using such a TFT, a mobile computer with less characteristic deterioration can be obtained.

Figure 26E:
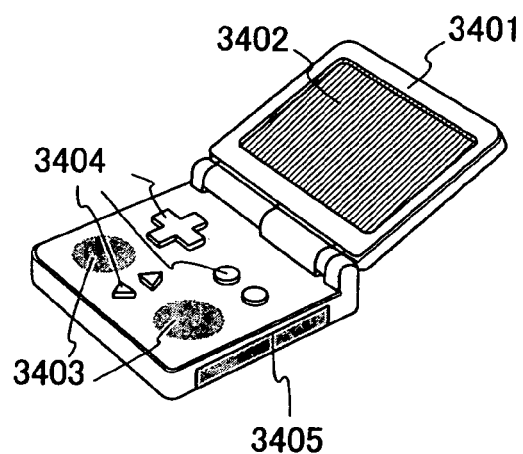

FIG. 26E is a portable game machine, which includes a housing 3401, a display portion 3402, speaker portions 3403, operation keys 3404, a recording medium insert portion 3405, and the like. An active matrix display device is provided in the display portion 3402. Each pixel of the display portion 3402 includes a TFT manufactured by the manufacturing method of the present invention. By using such a TFT, a portable game machine with less characteristic deterioration can be obtained.

Figure 27:
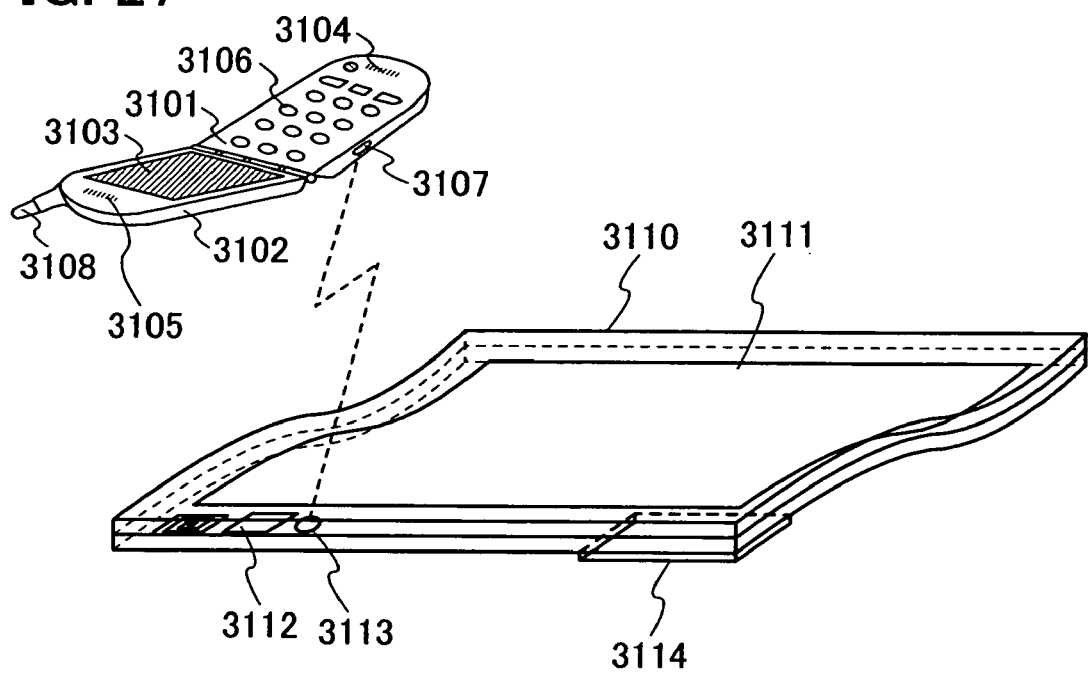
FIG. 27 is a perspective view showing an example of an electronic device according to Embodiment Mode 12.

FIG. 27 is a paper display, which includes a main body 3110, a pixel portion 3111, a driver IC 3112, a receiving device 3113, a film battery 3114, and the like. The receiving device 3113 can receive a signal from an infrared communication port 3107 of the above described cellular phone. An active matrix display device is provided in the pixel portion 3111. Each pixel of the pixel portion 3111 includes a TFT manufactured by the manufacturing method of the present invention. By using such a TFT, a paper display with less characteristic deterioration can be obtained.

As set forth above, the application range of the present invention is extremely wide, and the present invention can be applied to electronic devices in various fields.

This application is based on Japanese Patent Application serial No. 2005-280499 filed in Japan Patent Office on Sep. 27, 2005, the entire contents of which are hereby incorporated by reference.

What is claimed is:

1. A method for manufacturing a semiconductor device, comprising the steps of:
   forming a metal film over a polycrystalline semiconductor film; and
   performing a plasma oxidizing treatment to the metal film, thereby oxidizing the metal film to form a metal oxide film and oxidizing the polycrystalline semiconductor film to form an oxide film, wherein the oxide film is formed between the polycrystalline semiconductor film and the metal oxide film.

2. A method for manufacturing a semiconductor device, comprising the steps of:
   forming a metal film over a polycrystalline semiconductor film;

performing a plasma oxidizing treatment to the metal film, thereby oxidizing the metal film to form a metal oxide film and oxidizing the polycrystalline semiconductor film to form an oxide film, wherein the oxide film is formed between the polycrystalline semiconductor film and the metal oxide film; and performing plasma nitriding treatment to the metal oxide film to form a metal oxide film containing nitrogen at least at a surface of the metal oxide film.

3. The method for manufacturing a semiconductor device according to claim 1 or 2, wherein the metal film is one of an Al film, a Ta film, a La film, an Hf film, and a Zr film.

4. The method for manufacturing a semiconductor device according to claim 1 or 2, wherein the polycrystalline semiconductor film is formed by crystallizing an amorphous semiconductor film using a laser before forming the metal film over the polycrystalline semiconductor film.

5. The method for manufacturing a semiconductor device, according to claim 1, wherein the polycrystalline semiconductor film is an island-shaped polysilicon film.

6. The method for manufacturing a semiconductor device, according to claim 5, wherein the metal film is selectively formed only over a surface of the island-shaped polysilicon film.

7. The method for manufacturing a semiconductor device, according to claim 1, wherein the oxide film is a silicon oxide film having a thickness of between about 0.5 nm and about 1 nm.

8. The method for manufacturing a semiconductor device, according to claim 1, wherein a surface of the polycrystalline semiconductor film is uneven.

9. The semiconductor device according to claim 1, wherein the metal oxide film includes a metal nitride.

10. The method for manufacturing a semiconductor device, according to claim 2, wherein the polycrystalline semiconductor film is an island-shaped polysilicon film.

11. The method for manufacturing a semiconductor device, according to claim 10, wherein the metal film is selectively formed only over the surface of the island-shaped polysilicon film.

12. The method for manufacturing a semiconductor device, according to claim 2, wherein the oxide film is a silicon oxide film having a thickness of between about 0.5 nm and about 1 nm.

13. The method for manufacturing a semiconductor device, according to claim 2, wherein a surface of the polycrystalline semiconductor film is uneven.

14. The semiconductor device according to claim 2, wherein the metal oxide film includes a metal nitride.

* * * * *